US011863201B2

(12) United States Patent
Guo et al.

(10) Patent No.: US 11,863,201 B2
(45) Date of Patent: Jan. 2, 2024

(54) CORRELATION-BASED HARDWARE SEQUENCE FOR LAYERED DECODING

(71) Applicant: QUALCOMM Incorporated, San Diego, CA (US)

(72) Inventors: Nian Guo, Pasadena, CA (US); Yuksel Ozan Basciftci, Littleton, MA (US); Carsten Aagaard Pedersen, Bolton, MA (US); Murali Menon, Acton, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/711,642

(22) Filed: Apr. 1, 2022

(65) Prior Publication Data
US 2023/0318624 A1 Oct. 5, 2023

(51) Int. Cl.
*H03M 13/11* (2006.01)
*H03M 13/09* (2006.01)

(52) U.S. Cl.
CPC ....... *H03M 13/114* (2013.01); *H03M 13/098* (2013.01); *H03M 13/1111* (2013.01); *H03M 13/1131* (2013.01); *H03M 13/1168* (2013.01); *H03M 13/1191* (2013.01)

(58) Field of Classification Search
CPC ............ H03M 13/1111; H03M 13/098; H03M 13/1131; H03M 13/1168; H03M 13/1191; H03M 13/114
See application file for complete search history.

(56) References Cited

U.S. PATENT DOCUMENTS

| 8,650,457 | B1* | 2/2014 | Yeo ......................... G06F 11/10 714/755 |
| 2008/0301521 | A1* | 12/2008 | Gunnam ............ H03M 13/1177 714/757 |
| 2010/0037121 | A1* | 2/2010 | Jin ..................... H03M 13/6527 714/763 |

(Continued)

OTHER PUBLICATIONS

T. T. Bao Nguyen and H. Lee, "Efficient Four-way Row-splitting Layered QC-LDPC Decoder Architecture," 2018 International SoC Design Conference (ISOCC), Daegu, Korea (South), 2018, pp. 210-211.*

(Continued)

*Primary Examiner* — Steve N Nguyen
(74) *Attorney, Agent, or Firm* — Holland & Hart LLP

(57) ABSTRACT

Methods, systems, and devices for wireless communications are described. A wireless communication system may support techniques for correlation-based hardware sequences for layered decoding. In some cases, a user equipment (UE) may partition layers of a submatrix associated with a parity check decoding procedure into a first set of layers and a second set of layers. The UE may sort each set of layers into a respective set of layer orders (e.g., a first set of layer orders and a second set of layer orders) based on an associated set of correlation values. The UE may combine the first set of layer orders and the second set of layer orders to obtain a set of combined layer orders and may select a decoding schedule from a set of decoding schedules used for decoding each of the combined layer orders based on respective schedule lengths for the set of decoding schedules.

27 Claims, 11 Drawing Sheets

(56) References Cited

U.S. PATENT DOCUMENTS

| | | | | |
|---|---|---|---|---|
| 2011/0252294 | A1* | 10/2011 | Ng ...................... | H03M 13/116 |
| | | | | 714/E11.053 |
| 2014/0053037 | A1* | 2/2014 | Wang .................... | G11B 20/22 |
| | | | | 714/752 |
| 2014/0101510 | A1* | 4/2014 | Wang ................ | H03M 13/6343 |
| | | | | 714/758 |
| 2015/0303942 | A1* | 10/2015 | Zhang ................ | H03M 13/1117 |
| | | | | 714/763 |
| 2016/0091951 | A1* | 3/2016 | Han ........................ | G06F 11/10 |
| | | | | 714/752 |
| 2016/0336964 | A1* | 11/2016 | Khalil ................... | H04L 1/0057 |
| 2017/0117925 | A1* | 4/2017 | Achtenberg ...... | H03M 13/3746 |
| 2017/0141796 | A1* | 5/2017 | Koike-Akino ...... | H03M 13/033 |
| 2017/0331496 | A1* | 11/2017 | Lee ................... | H03M 13/3707 |
| 2019/0305882 | A1* | 10/2019 | Wang ................. | H03M 13/1128 |
| 2021/0075442 | A1* | 3/2021 | Myung ............. | H04L 25/03184 |

OTHER PUBLICATIONS

D. E. Hocevar, "A reduced complexity decoder architecture via layered decoding of LDPC codes," IEEE Workshop onSignal Processing Systems, 2004. SIPS 2004., Austin, TX, USA, 2004, pp. 107-112.*

G. Han and X. Liu, "An efficient dynamic schedule for layered belief-propagation decoding of LDPC codes," in IEEE Communications Letters, vol. 13, No. 12, pp. 950-952, Dec. 2009.*

Jia Li, Gaigai Yang and Zhiqiang Zhao, "An improved-performance decoding algorithm of LDPC codes for layered decoding," 2014 IEEE International Conference on Communiction Problem-solving, Beijing, China, 2014, pp. 318-321.*

* cited by examiner

CORRELATION-BASED HARDWARE SEQUENCE FOR LAYERED DECODING

FIELD OF TECHNOLOGY

The following relates to wireless communications, including correlation-based hardware sequence for layered decoding.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support correlation-based hardware sequences for layered decoding. Generally, the described techniques provide for generating a correlation-based decoding schedule (e.g., hardware sequence) for a decoding procedure (e.g., low-density parity-check (LDPC) decoding) of an encoded signal associated using a parity check base graph matrix. For example, a user equipment (UE) may receive, from a network entity, an encoded signal associated with a parity check decoding procedure and may identify a base graph matrix associated with the encoded signal. The UE may extract a submatrix from the base graph matrix and may partition the layers of the submatrix into sets of layers, such as a first set of layers and a second set of layers. In some cases, the UE may partition the layers into the sets of layers based on a punctured column for each layer. For example, the first set of layers may be associated with one punctured column and the second set of layers may be associated with two punctured columns. That is, each layer of the first set of layers may connect to one punctured column and each layer of the second set of layers may connect to two punctured columns.

Additionally, the UE may sort each set of layers into a respective set of layer orders based on an associated set of correlation values. For example, the UE may sort the first set of layers into a first set of layer orders based on a first set of correlation values associated with a first correlation table and may sort the second set of layers into a second set of layer orders based on a second set of correlation values associated with a second correlation table. In some cases, the UE may generate the correlation tables including the respective correlation values based on a quantity of overlapping columns in each combination of layers in the respective set of layers. For example, the UE may determine the first set of correlation values based on identifying a quantity of overlapping non-zero columns in each combination of layers of the first set of layers.

Upon sorting each set of layers in a set of layer orders (e.g., the first set of layer orders and the second set of layer orders), the UE may combine the sets of layer orders to obtain a set of combined layer orders. For example, the UE may concatenate each layer order or the first set of layer orders with each layer order of the second set of layer orders to obtain the set of combined layer orders. In some cases, the UE may generate a decoding schedule for each layer order of the set of combined layer orders to obtain a set of decoding schedules for decoding each of the set of combined layer orders. The UE may select a decoding schedule from the set of decoding schedules based on respective schedule lengths for the set of decoding schedules. For example, the UE may select a decoding schedule with the shortest schedule length and may decode the encoded signal based on the selected decoding schedule. In some cases, the UE may transmit feedback to the network entity indicating successful decoding of the encoded signal.

A method for wireless communications at a UE is described. The method may include partitioning a set of multiple layers of a submatrix associated with a parity check decoding procedure into a first set of layers and a second set of layers, sorting the first set of layers into a first set of layer orders based on a first set of correlation values associated with the first set of layers, sorting the second set of layers into a second set of layer orders based on a second set of correlation values associated with the second set of layers, combining the first set of layer orders and the second set of layer orders to obtain a set of combined layer orders, and selecting a decoding schedule from a set of decoding schedules for decoding each of the set of combined layer orders based on respective schedule lengths for the set of decoding schedules.

An apparatus for wireless communications at a UE is described. The apparatus may include a processor, memory coupled with the processor, and instructions stored in the memory. The instructions may be executable by the processor to cause the apparatus to partition a set of multiple layers of a submatrix associated with a parity check decoding procedure into a first set of layers and a second set of layers, sort the first set of layers into a first set of layer orders based on a first set of correlation values associated with the first set of layers, sort the second set of layers into a second set of layer orders based on a second set of correlation values associated with the second set of layers, combine the first set of layer orders and the second set of layer orders to obtain a set of combined layer orders, and select a decoding schedule from a set of decoding schedules for decoding each of the set of combined layer orders based on respective schedule lengths for the set of decoding schedules.

Another apparatus for wireless communications at a UE is described. The apparatus may include means for partitioning a set of multiple layers of a submatrix associated with a parity check decoding procedure into a first set of layers and a second set of layers, means for sorting the first set of layers into a first set of layer orders based on a first set of correlation values associated with the first set of layers, means for sorting the second set of layers into a second set of layer orders based on a second set of correlation values associated with the second set of layers, means for combining the first set of layer orders and the second set of layer orders to obtain a set of combined layer orders, and means for selecting a decoding schedule from a set of decoding schedules for decoding each of the set of combined layer orders based on respective schedule lengths for the set of decoding schedules.

A non-transitory computer-readable medium storing code for wireless communications at a UE is described. The code may include instructions executable by a processor to partition a set of multiple layers of a submatrix associated with a parity check decoding procedure into a first set of layers and a second set of layers, sort the first set of layers into a first set of layer orders based on a first set of correlation values associated with the first set of layers, sort the second set of layers into a second set of layer orders based on a second set of correlation values associated with the second set of layers, combine the first set of layer orders and the second set of layer orders to obtain a set of combined layer orders, and select a decoding schedule from a set of decoding schedules for decoding each of the set of combined layer orders based on respective schedule lengths for the set of decoding schedules.

Some examples of the method, apparatuses, and non-transitory computer-readable medium described herein may further include operations, features, means, or instructions for determining the first set of correlation values based on one or more combinations of layers of the first set of layers and generating a first correlation table including the first set of correlation values.

Some examples of the method, apparatuses, and non-transitory computer-readable medium described herein may further include operations, features, means, or instructions for selecting a starting layer from the first set of layers for a first layer order and sorting a set of remaining layers of the first set of layers for the first layer order based on the first set of correlation values, where the first set of layer orders includes the first layer order.

Some examples of the method, apparatuses, and non-transitory computer-readable medium described herein may further include operations, features, means, or instructions for identifying a quantity of overlapping non-zero columns in each combination of the one or more combinations of layers of the first set of layers, where the first set of correlation values may be based on the quantity of overlapping non-zero columns.

Some examples of the method, apparatuses, and non-transitory computer-readable medium described herein may further include operations, features, means, or instructions for determining the second set of correlation values based on one or more combinations of layers of the second set of layers and generating a second correlation table including the second set of correlation values.

Some examples of the method, apparatuses, and non-transitory computer-readable medium described herein may further include operations, features, means, or instructions for selecting a starting layer from the second set of layers for a first layer order and sorting a set of remaining layers of the second set of layers for the first layer order based on the second set of correlation values, where the second set of layer orders includes the first layer order.

Some examples of the method, apparatuses, and non-transitory computer-readable medium described herein may further include operations, features, means, or instructions for identifying a quantity of overlapping non-zero columns in each combination of the one or more combinations of layers of the first set of layers, where the first set of correlation values may be based on the quantity of overlapping non-zero columns.

In some examples of the method, apparatuses, and non-transitory computer-readable medium described herein, combining the first set of layer orders and the second set of layer orders may include operations, features, means, or instructions for concatenating each layer order of the first set of layer orders with each layer order of the second set of layer orders to obtain the set of combined layer orders.

Some examples of the method, apparatuses, and non-transitory computer-readable medium described herein may further include operations, features, means, or instructions for partitioning the set of multiple layers of the submatrix may be based on a punctured column for each layer of the set of multiple layers.

In some examples of the method, apparatuses, and non-transitory computer-readable medium described herein, the first set of layers may be associated with one punctured column and the second set of layers may be associated with two punctured columns.

Some examples of the method, apparatuses, and non-transitory computer-readable medium described herein may further include operations, features, means, or instructions for generating a respective decoding schedule for each layer order of the set of combined layer orders to obtain the set of decoding schedules.

Some examples of the method, apparatuses, and non-transitory computer-readable medium described herein may further include operations, features, means, or instructions for determining a respective schedule length for each decoding schedule of the set of decoding schedules and selecting the decoding schedule having a length below a threshold.

Some examples of the method, apparatuses, and non-transitory computer-readable medium described herein may further include operations, features, means, or instructions for receiving a encoded signal associated with the parity check decoding procedure, identifying a base graph matrix associated with the encoded signal, extracting the submatrix from the base graph matrix associated with the encoded signal, and decoding the encoded signal based on the selected decoding schedule.

DETAILED DESCRIPTION

Figure 1:
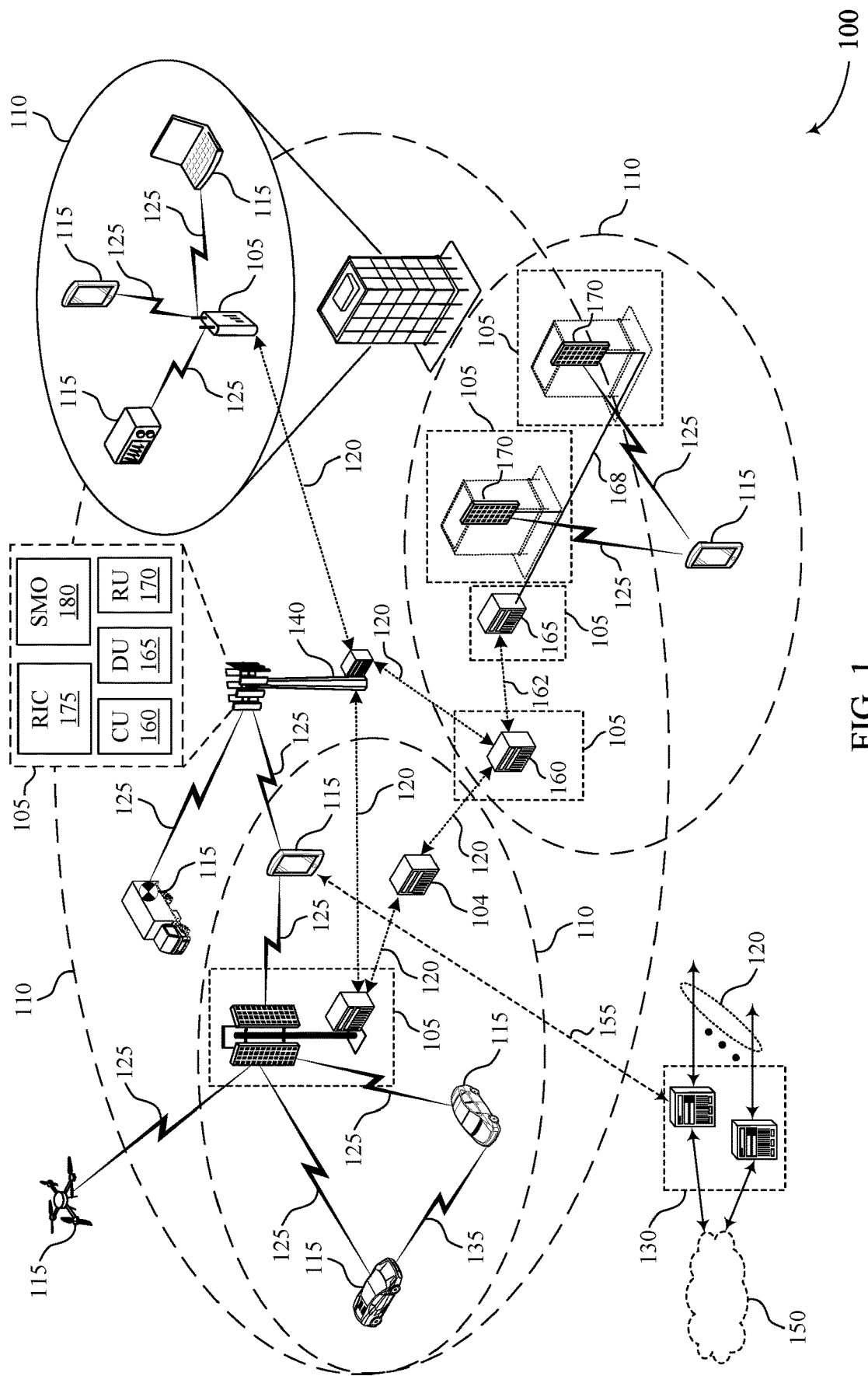
FIG. 1 illustrates an example of a wireless communications system that supports correlation-based hardware sequences for layered decoding in accordance with one or more aspects of the present disclosure.

Some wireless communications systems may support low-density parity-check (LDPC) decoding, such that a user equipment (UE) may support layered decoding of encoded signals including LDPC codes. In some cases (e.g., in new radio (NR) communications), LDPC codes may be characterized by two parity check base graph matrices (e.g., BG1 and BG2) where a row in the base graph matrix may represent a layer in layered decoding and each entry of the base graph matrix may be a submatrix block, equal to an all-zero matrix or a cyclic-shifted (e.g., non-zero) identity matrix. For a given code rate, the UE may extract a submatrix from the full base graph matrix to use as the parity check base matrix (e.g., for rate matching). In layered decoding, the UE may scan and update log likelihood ratios (LLRs) associated with each non-zero submatrix block (e.g., each node) in a parity check base graph matrix, where the LLRs associated with a single node may be scanned or updated in one hardware cycle. Traditionally, a UE uses a hardware sequence (e.g., decoder schedule) to determine which node the UE should scan and which node the UE should update at each hardware cycle, which is a computationally complex and resource intensive procedure.

Techniques described herein may support correlation-based hardware sequences for layered decoding. In some cases, to improve hardware sequence or decoding schedule selection for LDPC layered decoding, a UE may extract a submatrix from a full base graph matrix associated with an encoded signal and may partition each layer of the submatrix into two sets according to the number of punctured columns for each layer. For example, a first set of layers (e.g., Type 1) may include layers that correspond to 1 punctured column and a second set of layers (e.g., Type 2) may include layers that correspond to 2 punctured columns. After partitioning the layers, the UE may order the layers of each type and build correlation tables based on combinations of layers of the respective type. For example, the UE may determine a correlation value between each pair of layers in the first set of layers based on the quantity of overlapping non-zero columns between the pair of layers and may generate a first correlation table based on the determined correlation values. In some cases, the UE may determine a layer order by selecting a first layer from the first set of layers as a starting layer and searching the correlation for a second layer that has the smallest correlation value when correlated with the first layer. The UE may continue the searching process for all layers from the first set of layers and may determine additional layer orders (e.g., a first set of layer orders) by using each layer from the first set of layers as the starting layer and performing the search in a similar manner. The UE may perform the aforementioned process with the second set of layers to determine a second set of layer orders.

After determining the first set of layer orders and the second set of layer orders, the UE may concatenate the first set of layer orders and the second set of layer orders to obtain a combined set of layer orders. The UE may determine a decoding schedule for each layer order of the combined set of layer orders and may select a decoding schedule based on the based on the respective schedule lengths (e.g., may select the decoding schedule with the shortest schedule length or having a length below a threshold). The UE may perform layered decoding of an encoded signal using the selected decoding schedule.

Aspects of the disclosure are initially described in the context of wireless communications systems. Aspects of the disclosure are then described in the context of a flow chart and a process flow. Aspects of the disclosure are further illustrated by and described with reference to apparatus diagrams, system diagrams, and flowcharts that relate to correlation-based hardware sequences for layered decoding.

FIG. 1 illustrates an example of a wireless communications system 100 that supports correlation-based hardware sequences for layered decoding in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, an NR network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another over a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 through a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 175 is flexible and may support different functionalities depending upon which functions (e.g., network layer functions, protocol layer functions, baseband functions, RF functions, and any combinations thereof) are performed at a CU 160, a DU 165, or an RU 175. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication over such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support correlation-based hardware sequences for layered decoding as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) over one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both) such that the more resource elements that a device receives and the higher the order of the modulation scheme, the higher the data rate may be for the device. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be able to communicate directly with other UEs 115 over a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by or scheduled by the network entity 105. In some examples, one or more UEs 115 in such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without the involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, which may be referred to as clusters, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the network entities 105 (e.g., base stations 140, RUs 170), and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. While operating in unlicensed RF spectrum bands, devices such as the network entities 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located in diverse geographic locations. A network entity 105 may have an antenna array with a set of rows and columns of antenna ports that the network entity 105 may use to support beamforming of communications with a UE 115. Likewise, a UE 115 may have one or more antenna arrays that may support various MIMO or beamforming operations. Additionally, or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The UEs 115 and the network entities 105 may support retransmissions of data to increase the likelihood that data is received successfully. Hybrid automatic repeat request (HARQ) feedback is one technique for increasing the likelihood that data is received correctly over a communication link (e.g., a communication link 125, a D2D communication link 135). HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In some other examples, the device may provide HARQ feedback in a subsequent slot, or according to some other time interval.

The wireless communications system 100 may support correlation-based hardware sequences for layered decoding (e.g., LDPC layered decoding). For example, a UE 115 may receive, from a network entity 105, an encoded signal associated with an LDPC decoding procedure. The UE 115 may identify a base graph matrix associated with the encoded signal and extract a submatrix from the base graph matrix. The UE 115 may partition (e.g., sort) the layers of the submatrix into two sets of layers (e.g., Type 1 and Type 2). In some cases, the UE 115 may partition the layers of the submatrix based on a punctured column for each layer. For example, a first set of layers may include layers associated with one punctured column and a second set of layers may include layers associated with two punctured columns.

In some cases, the UE 115 may generate a correlation table for each set of layers. For example, the UE 115 may determine a first set of correlation values between each possible combination of layers (e.g., each pair of layers) in the first set of layers and generate a first correlation table based on the determined first set of correlation values. In some cases, the first set of correlation values may be based on a quantity of non-zero overlapping columns between each pair of layers. The UE 115 may sort each set of layers into a respective set of layer orders based on an associated correlation table. In some cases, the UE 115 may generate each set of layer orders based on a searching procedure (e.g., greedy search). For example, the UE 115 may select a starting layer from the first set of layers and may sort the remaining layers of the first set of layers based on the first set of correlation values associated with the first correlation table to determine a first layer order. The UE 115 may repeat this process using each layer of the first set of layers as a starting layer to generate a first set of layer orders.

Upon sorting each set of layers into the respective set of layer orders, the UE 115 may combine (e.g., concatenate) the two sets of layer orders to obtain a set of combined layer orders. In some cases, the UE 115 may generate a decoding schedule for each layer order of the set of combined layer orders to obtain a set of decoding schedules and may identify a schedule length associated with each layer order of the set of combined layer orders. The UE 115 may select a decoding schedule from the set of decoding schedules based on respective schedule lengths. For example, the UE 115 may select a decoding schedule from the set of decoding schedules with the shortest schedule length. The UE 115 may decode the encoded signal according to the selected decoding schedule and, in some cases, may transmit a feedback message to the network entity 105 indicating successful decoding of the encoded signal.

Figure 2:
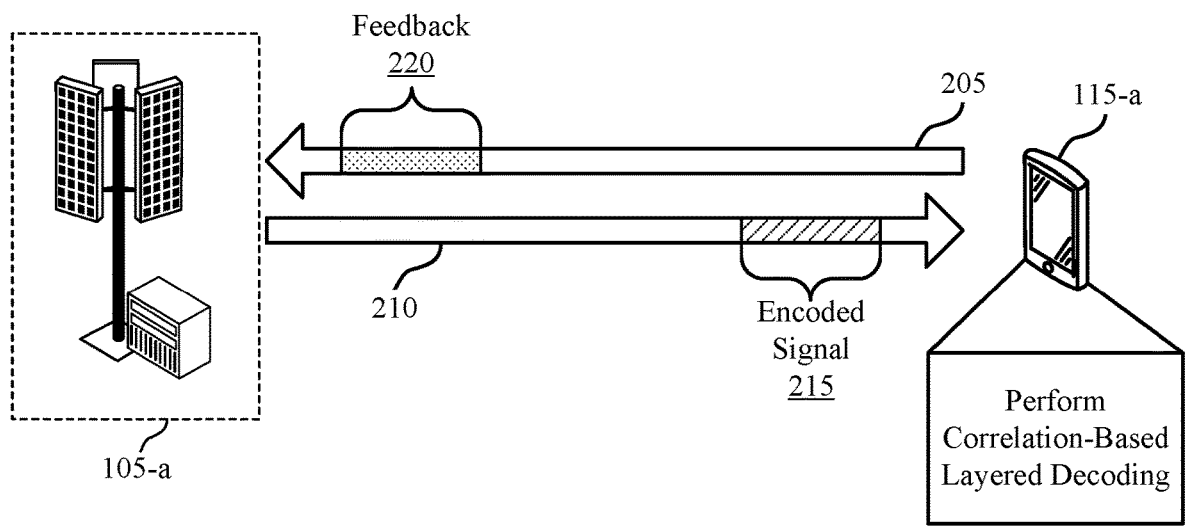
FIG. 2 illustrates an example of a wireless communications system that supports correlation-based hardware sequences for layered decoding in accordance with one or more aspects of the present disclosure.

FIG. 2 illustrates an example of a wireless communications system 200 that supports correlation-based hardware sequences for layered decoding in accordance with one or more aspects of the present disclosure. The wireless communications system 200 may implement or be implemented by aspects of the wireless communications system 100. For example, the wireless communications system 200 may include a network entity 105-*a* and a UE 115-*a*. The UE 115-*a* may represent an example of a UE 115 as described herein, including with reference to FIG. 1. The network entity 105-*a* may represent an example of a network entity 105 as described herein, including with reference to FIG. 1.

Additionally, the wireless communications system 200 may support communications between the UE 115-*a* and the network entity 105-*a*. For example, the UE 115-*a* may transmit uplink messages to the network entity 105-*a* over a communication link 205 (which may be an example of a communication link 125 described with reference to FIG. 1) and may receive downlink messages on a communication link 210 (which may be an example of a communication link 125). For example, the network entity 105-*a* may transmit an encoded signal 215 to the UE 115-*a* and the UE 115-*a* may decode the encoded signal 215 according to a correlation-based decoding schedule (e.g., hardware sequence).

Some wireless communications systems, such as the wireless communications system 200, may support LDPC decoding, such that a UE 115-*a* may support layered decoding (e.g., LDPC layered decoding) of an encoded signal 215, the encoded signal 215 including LDPC codes. In layered decoding, the UE 115-*a* may partition check nodes, or edge nodes connected to multiple variable nodes, associated with the encoded signal 215 into layers and implement a message passing algorithm layer by layer. That is, for each layer, the message passing algorithm may perform (e.g., be divided into) a scan phase and an update phase. In the scan phase, the message passing algorithm may scan the LLRs of the variable nodes connected to each check node in the respective layer to identify known values for the LLRs. The variable nodes may forward known values to the check nodes and the check nodes may accumulate the forwarded values. Additionally, the check nodes may use the known values for the LLRs to calculate (e.g., accumulate) the parity using a minimum sum (min-sum) algorithm and send the outputted (e.g., accumulated) parity to the variable nodes. In the update phase, the message passing algorithm may update the LLRs in the variable nodes based on the outputted parity. The UE 115-*a* may continue to perform the message passing In some cases (e.g., 5G NR communications), LDPC codes associated with the layered decoding may be characterized by two parity check base graph matrices (e.g., BG1 and BG2). A row in a base graph matrix may represent a layer in layered decoding and each entry in the base graph matric may be a submatrix block. In some case, the submatrix block may be equal to an all-zero matrix or a cycle-shifted identify matrix. Further, the UE 115-*a* may determine the size of the submatrix block based on an expansion factor. Based on a code rate, the UE 115-*a* may extract a submatrix from a full base graph matrix as a parity check base matrix for rate match. Additionally, in layered decoding, the UE 115-*a* may scan and update LLRs associated with each non-zero (e.g., cyclic-shifted identity) submatrix block (e.g., node) in a parity check base matrix. In some cases, the UE 115-*a* may identify a non-zero submatrix block based on a layer identifier (ID) and a column ID.

In some cases, the UE 115-*a* may scan or update the LLRs associated with a check node at one hardware cycle. The UE 115-*a* may use a hardware sequence, which may be referred to as a decoding schedule or decoder schedule, to determine which node the UE 115-*a* should scan and which node it should update at each hardware cycle. That is, the decoding schedule may indicate a layer order in which the UE 115-*a* may scan and update nodes. In some cases, the decoding schedule may include a scan table and an update table.

In some cases, the UE 115-*a* may fully scan a layer and wait for pipeline stage cycles before updating the layer. In some cases, the UE 115-*a* may update a column prior to scanning the column again. In some cases, the total number of processing layers at any hardware cycle may not exceed a cache limit (e.g., a layer may be being processed if the UE 115-*a* has started to scan a layer but has not fully yet updated the columns in the layer). In some cases, the scan table and the update tables may be repeatable for each iteration and may be the same size.

In some cases, the UE 115-*a* may use a baseline decoding schedule to decode the encoded signal 215. For example, given a submatrix, the UE 115-*a* may determine a layer order using a two-step method. In the first step, the UE 115-*a* may partition all of the layers in the submatrix according to the number of punctured columns they connect to. In some cases, a Type 1 set of layers may include all layers that connect to one punctured column and a Type 2 set of layers may include all layers that connect to two punctured columns. In the second step, the UE 115-*a* may further sort the layers in each type (e.g., Type 1 and Type 2) according to their row weights in an ascending manner. The UE 115-*a* may then concatenate (e.g., combine) the sorted layers in each type to form a combined layer order. However, traditional techniques for determining a decoding schedule, such as those described previously, may be computationally complex and resource intensive.

Techniques described herein may support generation of correlation-based decoding schedules (e.g., hardware sequences). In some cases, the UE 115-*a* may receive the encoded signal 215 associated with an LDPC decoding procedure and may identify a base graph matrix associated with the encoded signal 215. The UE 115-*a* may extract a submatrix from the base graph matrix associated with the encoded signal 215 and may partition the layers of the submatrix into two sets of layers, including a first set of layers and a second set of layers. Upon partitioning the layers, the UE 115-*a* may sort each set of layers into multiple layer orders, including a first set of layer orders associated with the first set of layers and a second set of layer orders associated with the second set of layers. The sorting may be based on a respective set of correlation values associated with each set of layers, as described further with respects to FIG. 3. The UE 115-*a* may combine (e.g., concatenate) the two sets of layers to obtain a set of combined layers. That is, the UE 115-*a* may combine each layer order of the first set of layer orders with each layer order of the second set of layer orders to obtain the set of combined layer orders. The UE 115-*a* may generate a decoding schedule for each layer order of the set of combined layer orders to obtain a set of decoding schedules.

In some cases, the UE 115-*a* may build each decoding schedule (e.g., initialize a schedule table) by stacking nodes according to the respective layer order of the set of combined layer orders (e.g., stacking nodes from a most prioritized layer to the beginning of the scan table). Upon stacking the nodes, the UE 115-*a* may proceed to build the respective decoding schedule hardware cycle by hardware cycle and at each hardware cycle, the UE 115-*a* may determine a node to be scanned. If a cache limit has not been reached, the UE 115-*a* may select nodes whose layer is prioritized in the layer order (e.g., higher in the layer order), otherwise, the UE 115-*a* may select nodes that lie in the processing layers. In some cases, such nodes may not be present (e.g., do not exist) and the UE 115-*a* may set a current cycle in the scan table as a null cycle. In some other cases, multiple such nodes may be present and the UE 115-*a* may select a node whose column appears the most frequently in the remaining unscanned nodes. Additionally, the UE 115-*a* may determine the node to be updated. Among all of the nodes that can be updated, the UE 115-a may select a node whose column appears earliest in the remaining unscanned nodes, where the unscanned nodes are sorted according to their layer orders. In some cases, such nodes may not be present and the UE 115-a may set the current cycle in the update table as a null cycle.

Once the UE 115-a has scanned and update all nodes in the given submatrix, the UE 115-a may match the lengths of the scan and the update tables by appending null cycles to the shorter one. In some cases, the update table may start later than the scan table such that there may be an overlapping region at the boundary from one iteration to the next iteration. In some cases, the UE 115-a may reorder nodes in the overlapping region (e.g., if any hardware constraint breaks).

Upon building the set of decoder schedules, the UE 115-a may select a decoding schedule for use in decoding the encoded signal 215 based on respective schedule lengths for generate decoding schedules. For example, the UE 115-a may select a decoding schedule with the shortest schedule length and may decode the encoded signal 215 according to the decoding schedule.

In some cases, the UE 115-a may divide decoding iterations into two phases. In phase 1 iterations, the UE 115-a may ignore the first four layers and may use the schedule built for the rest of the layers (e.g., partial iteration). In phase 2 iterations, the UE 115 may use the schedule built for all layers. In some cases, the UE 115-a may transmit feedback 220 to the network entity 105 indicating successful decoding of the encoded signal 215.

Techniques described herein may result in the design of efficient schedules for LDPC layered decoding (e.g., under hardware constraints). Designing efficient layered-decoding schedules may result in efficient decoding operations, improved schedule performance, improved error performance (e.g., considering complexity tradeoffs), and shorter schedule lengths.

Though described in the context of the UE 115-a, it is understood that any wireless device may support the techniques described herein to perform correlation-based layered decoding of an encoded signal 215 or message. In one example, network entity 105-a may receive an encoded signal 215 from the UE 115-a and perform correlation-based layered decoding using the techniques described herein. Additionally or alternative, though described in the context of partitioning the layers of the submatrix into two sets of layers, it is understood that any quantity of sets may be supported.

Figure 3:
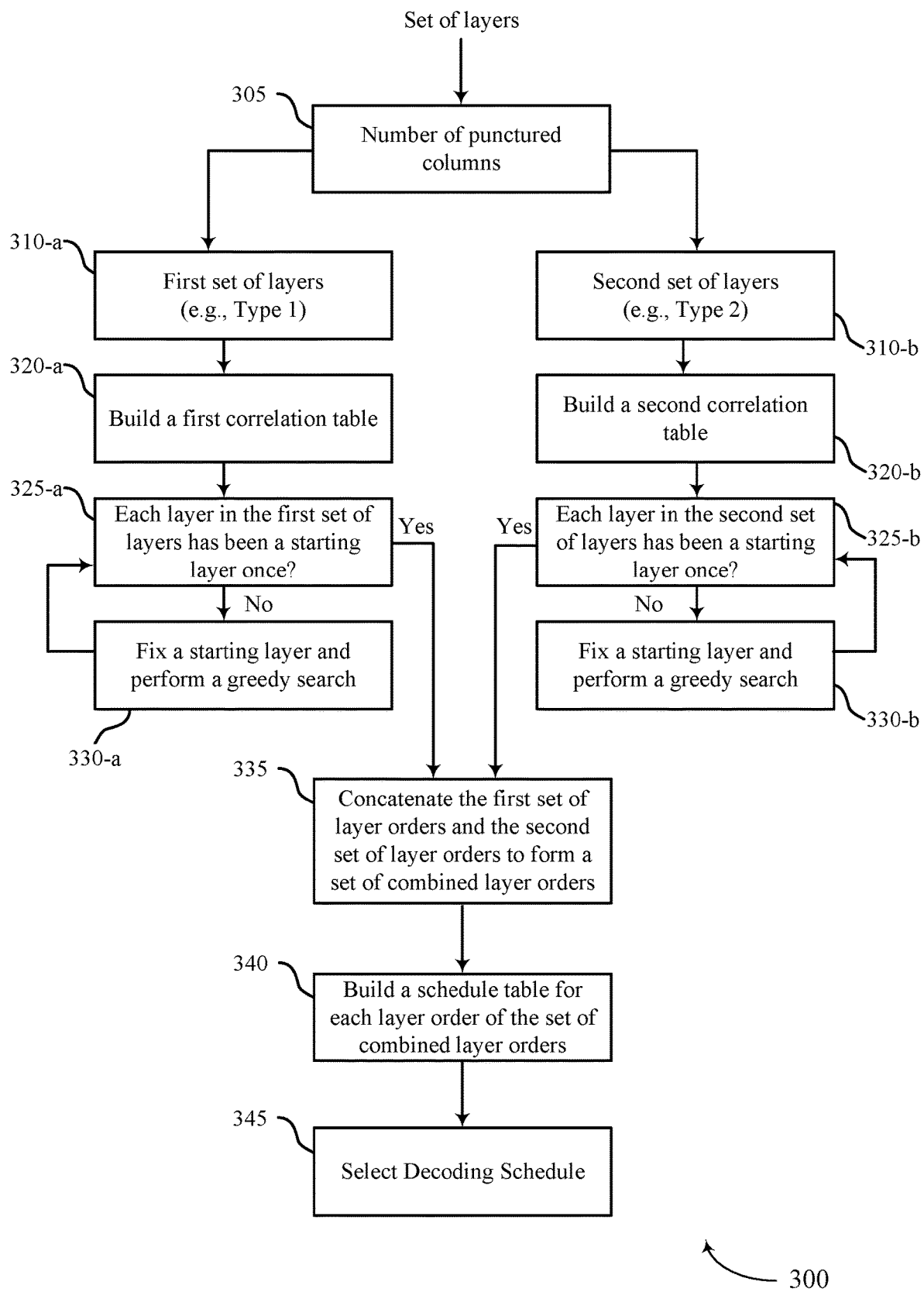
FIG. 3 illustrates an example of a flow chart that supports correlation-based hardware sequences for layered decoding in accordance with one or more aspects of the present disclosure.

FIG. 3 illustrates an example of a flow chart 300 that supports correlation-based hardware sequences for layered decoding in accordance with one or more aspects of the present disclosure. The flow chart 300 may implement or be implemented by aspects of the wireless communications system 100 and wireless communications system 200. For example, a UE 115 may implement the flow chart 300 to decode an encoded signal.

In some cases, a UE 115 may extract a submatrix from a base graph matric associated with an encoded signal and, at 305, may partition the layers of the submatrix into two sets of layers, including a first set of layers, at 310-a, and a second set of layers, at 310-b. In some cases, the UE 115-a may partition the layers according to the number of punctured columns each layer connects to. For example, the first set of layers may contain layers that connect to one punctured column (e.g., Type 1) and the second set of layers may contain layers that connect to two punctured columns (e.g., Type 2). At 320, the UE 115 may generate (e.g., build) a correlation table for each set of layers. For example, at 320-a, the UE 115 may generate a first correlation table for the first set of layers and, at 320-b, the UE 115 may generate a second correlation table for the second set of layers. The correlation tables may include a respective set of correlation values between each possible combination of layers in the respective set of layers. That is, the first correlation table may include a first set of correlation values associated with the first set of layers and the second correlation table may include a second set of correlation values associated with the second set of layers.

Correlation between a pair of layers (e.g., combination of layers) may be associated with the number of overlapping (non-zero) columns between the pair of layers in the base graph matrix. For example, in a base graph matrix (e.g., BG1), a layer 5 may be non-zero at columns, 1, 2, and 27 and a layer 8 may be non-zero at columns, 1, 2, 5, 8, 9, 15, and 30. The correlation value between layer 5 and layer 8 may be two due to overlapping columns 1 and 2 (e.g., non-zero columns). A sum correlation of a layer order may be the sum of correlations between consecutive layers in the layer order. For example, the sum correlation of a layer order [A, B, C, D] may be the sum of correlations between AB, BC, and CD. A correlation table for a set of layers may store the sum correlations (e.g., correlation) between any two layers (e.g., pair or combination of layers) in the set. For example, an entry in the $i^{th}$ row and the $j^{th}$ column may represent the correlation between the $i^{th}$ layer and the $j^{th}$ layer in the base graph matrix.

In some cases, at 325, the UE 115 may select a starting layer from a set of layers for a layer order and may perform a search, such as a greedy search, to determine the remainder of the layer order. In some cases, the complexity of searching a layer order that leads to a minimum sum correlation may increase (e.g., factorially) with the cardinality of the layer order (e.g., quantity of layers in the layer order) and, as such, the UE 115-a may search (e.g., greedy search) the correlation tables to reduce the complexity. That is, given a current layer, the UE 115-a may select the next layer that has a minimum correlation with the current layer as the next layer. For example, at 325-a, the UE 115 may select a first layer from the first set of layers to be the starting layer of a first layer order. At 330-a, the UE 115 may search a first correlation table associated with the first set of layers to determine a second layer from a set of remaining layers from the first set of layers that has a minimum correlation with the first layer. Upon selecting the second layer, the UE 115 may search the first correlation table to determine a third layer from the set of remaining layers that has a minimum correlation with the second layer. The UE 115 may continue this process until all layers of the first set of layers have been sorted (e.g., ordered), resulting in the first layer order. Additionally, the UE 115 may repeat this process using each layer of the first set of layers as a starting layer at least once, resulting in a first set of layer orders (e.g., producing Type 1 cardinality number of layers). Further, the UE 115, at 325-b and 330-b, may repeat the process with the second set of layers to determine the second set of layer orders (e.g., producing Type 2 cardinality number of layers).

Upon determining the first set of layer orders and the second set of layer orders, the UE 115, at 335, may concatenate (e.g., combine) the first set of layer orders with the second set of layer orders. That is, the UE 115 may combine each layer order of the first set of layer orders with each layer order of the second set of layer orders to determine a set of combined layer orders (e.g., producing Type 1 cardinality*Type 2 cardinality number of combined layer orders).

In some cases, at 340, the UE 115 may generate (e.g., build) a decoding schedule table (e.g., using a baseline algorithm) for each layer order (e.g. candidate layer order) of the set of combined layer orders and, at 345, may select a decoding schedule that has the shortest schedule length (e.g., phase 2 schedule length). In some cases, sum correlation may be positively correlated with schedule length. That is, a smaller sum correlation may lead to a decrease quantity of hardware cycles performed by the UE 115 while decoding the encoded signal. In such cases, the UE 115 may determine whether a combined layer order will lead to a short schedule length based on the sum correlation (e.g., rather than building a decoding schedule). The selected decoding schedule may be the correlation-based decoding schedule (e.g., hardware sequence) for the given submatrix. The UE 115 may decode an encoded signal associated with the given submatrix using the selected decoding schedule.

The techniques described herein may support prioritizing layers with higher reliability to support increased error performance and may leverage correlations to search (e.g., greedily search) a layer order that may lead to a short schedule length. Such techniques may result in increased performance compared to traditional techniques.

Figure 4:
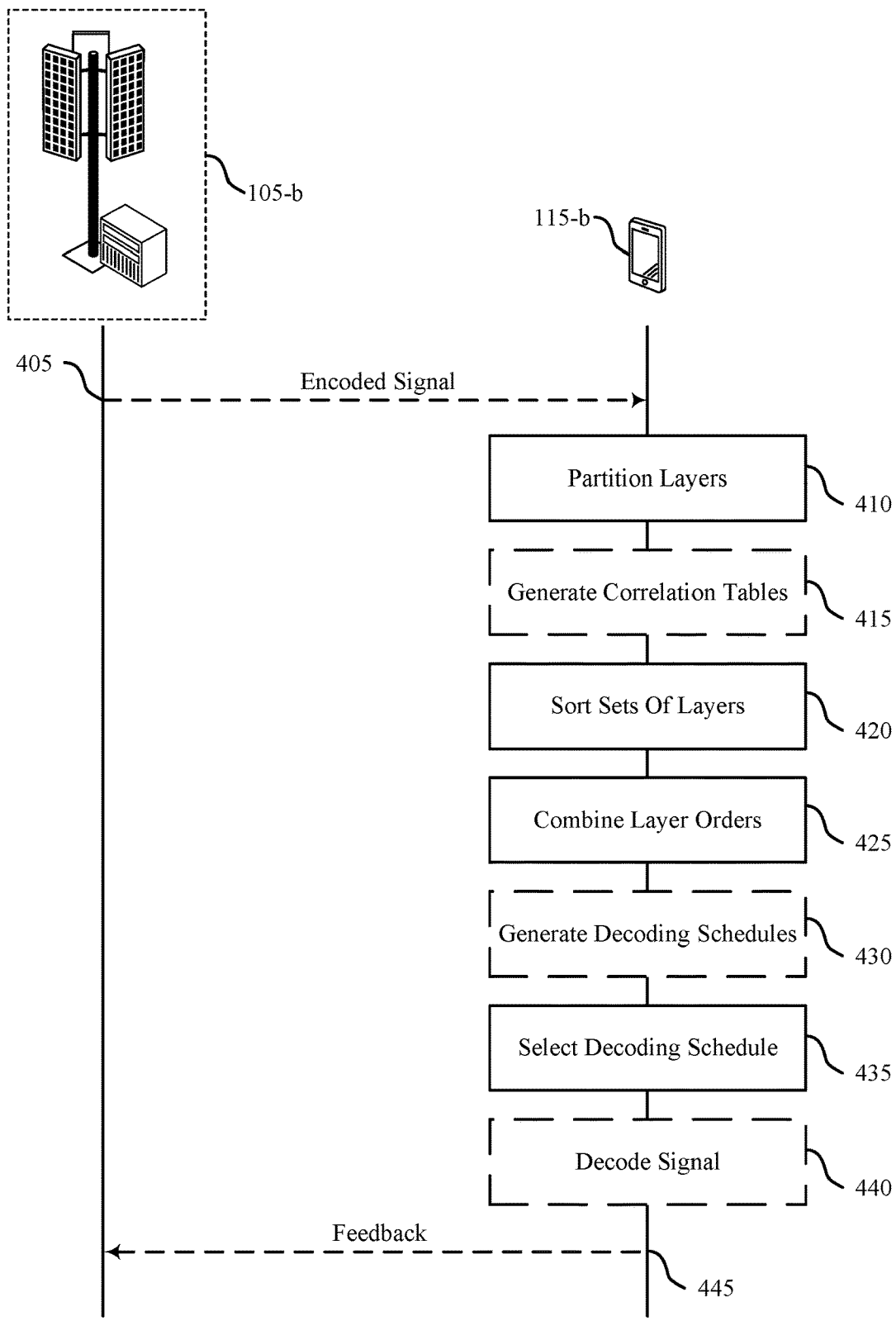
FIG. 4 illustrates an example of a process flow that supports correlation-based hardware sequences for layered decoding in accordance with one or more aspects of the present disclosure.

FIG. 4 illustrates an example of a process flow 400 that supports correlation-based hardware sequences for layered decoding in accordance with one or more aspects of the present disclosure. The process flow 400 may implement or be implemented by aspects of the wireless communications system 100, the wireless communications system 200, and the flow chart 300. For example, the process flow 400 may include a network entity 105-b and a UE 115-b. The UE 115-b may represent an example of a UE 115 as described herein, including with reference to FIG. 1. The network entity 105-b may represent an example of a network entity 105 as described herein, including with reference to FIG. 1. For example, the network entity 105-b may transmit an encoded signal to the UE 115-b and the UE 115-b may decode the encoded signal using a correlation-based hardware sequence.

In some cases, at 405, the UE 115-b may receive an encoded signal associated with a parity check decoding procedure. The encoded signal may include LDPC codes which may be characterized by two parity check base graph matrices. The UE 115-b may identify a parity check base graph matrix (e.g., a full parity check base graph matrix) associated with the encoded signal and may extract a submatrix from the parity check base graph matrix (e.g., given a code rate). In some cases, the extracted submatrix may be for rate match.

At 410, the UE 115-b may partition the layers of the extracted submatrix associated with the parity check decoding procedure into a first set of layers and a second set of layers. In some cases, the UE 115-b may partition the layers of the submatrix based on a puncture column for each layer. For example, the first set of layers may be associated with one punctured column and the second set of layers may be associated with two punctured columns.

In some cases, at 415, the UE 115-b may determine correlation values and generate correlation tables for each set of layers (e.g., the first set of layers and the second set of layers). For example, the UE 115-b may determine a first set of correlation values associated with the first set of layers based on one or more combinations of the layers of the first set of layers. That is, the UE 115-b may determine a correlation value for each possible combination of two layers of the first set of layers. The UE 115-b may determine the first set of correlation values by identifying a quantity of overlapping non-zero columns in each combination of layers (e.g., each combination of two layers) of the first set of layers. In some cases, the UE 115-b may generate a first correlation table including the first set of correlation values.

Additionally, the UE 115-b may perform this process with the second set of layers. For example, the UE 115-b may determine a second set of correlation values associated with the second set of layers based on one or more combinations of the layers of the second set of layers. That is, the UE 115-b may determine a correlation value for each possible combination of two layers of the second set of layers. The UE 115-b may determine the second set of correlation values by identifying a quantity of overlapping non-zero columns in each combination of layers (e.g., each combination of two layers) of the second set of layers. In some cases, the UE 115-b may generate a second correlation table including the second set of correlation values.

At 420, the UE 115-b may sort each set of layers into a respective set of layer orders. For example, the UE 115-b may sort the first set of layers into a first set of layer orders based on the first set of correlation values (e.g., in the first correlation table) associated with the first set of layers. Additionally, the UE 115-b may sort the second set of layers into a second set of layer orders based on the second set of correlation values (e.g., in the second correlation table) associated with the second set of layers.

In some cases, the UE 115-b may determine a layer order in a given set of layer orders (e.g., in the first set of layer orders or the second set of layer orders) based on a searching procedure (e.g., greedy search procedure). For example, the UE 115-b may select a starting layer from the first set of layers for a first layer order associated with the first set of layers and may sort a set of remaining layers of the first set of layers for the first layer order based on the first set of correlation values. In some cases, the UE 115-b may sort the set of remaining layers by performing the searching procedure. That is, the UE 115-b may select the starting layer from the first set of layers and may search (e.g., greedy search) the first correlation table to identify a minimum correlation value associated with the starting layer. For example, the UE 115-b may identify a second layer from the first set of layers that has a minimum correlation value to the starting layer (e.g., has the smallest correlation value out of a set of correlation values associated with the starting layer). The UE 115-b may then search the first correlation table to identify a third layer with a minimum correlation value associated with the second layer (e.g., out of a remaining set of layers which may include the first set of layers except the starting layer and the second layer). The UE 115-b may repeat this process until all layers of the first set of layers have been ordered and the first layer order associated with the first set of layers has been determined (e.g., generated). Further, the UE 115-b may repeat this process with each layer of the first set of layers acting as a starting layer (e.g., being a starting layer once). In such cases, the first set of layer orders may include a quantity of layer orders equal to the quantity of layers in the first set of layers (e.g., cardinality of the first set of layers).

Additionally, the UE 115-b may perform this process with the second set of layers. For example, the UE 115-b may select a starting layer from the second set of layers for a first layer order associated with the second set of layers and may sort a set of remaining layers of the second set of layers for the first layer order based on the second set of correlation values. In some cases, the UE 115-*b* may sort the set of remaining layers by performing the searching procedure. That is, the UE 115-*b* may select the starting layer from the second set of layers and may search (e.g., greedy search) the second correlation table to identify a second layer from the second set of layers with a minimum correlation value associated with the starting layer. The UE 115-*b* may repeat this process until all layers of the second set of layers have been ordered and the first layer order associated with the second set of layers has been determined (e.g., generated). Further, the UE 115-*b* may repeat this process with each layer of the second set of layers acting as a starting layer (e.g., being a starting layer once). In such cases, the second set of layer orders may include a quantity of layer orders equal to the quantity of layers in the second set of layers (e.g., cardinality of the second set of layers).

At 425, the UE 115-*b* may combine (e.g., concatenate) the first set of layer orders and the second set of layer orders to obtain a set of combined layer orders. That is, the UE may concatenate each layer order of the first set of layer orders with each layer order of the second set of layer orders to obtain the set of combined layer orders. In such cases, the set of combined layer orders may contain a quantity of layer orders equal to the quantity of layer orders in the first set of layer orders times the quantity of layer orders in the second set of layer orders.

In some cases, at 430, the UE 115-*b* may generate a respective decoding schedule for each layer order of the set of combined layer orders to obtain a set of decoding schedules. The set of decoding schedules may be used decode each of the set of combined layer orders.

At 435, the UE 115-*b* may select a decoding schedule from the set of decoding schedules based on respective schedule lengths for the set of decoding schedules. For example, the UE 115-*b* may determine a respective schedule length for each decoding schedule of the set of decoding schedules and select the decoding schedule having a length below a threshold. In some cases, the selected decoding schedule may be a decoding schedule with the shortest schedule length (e.g., a duration associated with decoding an encoded signal according to the selected decoding schedule is the shortest).

In some cases, at 440, the UE 115-*b* may decode the encoded signal based on (e.g., according to) the selected decoding schedule and, at 445, may transmit feedback to the network entity 105-*b* indicating successful decoding of the encoded signal.

Figure 5:
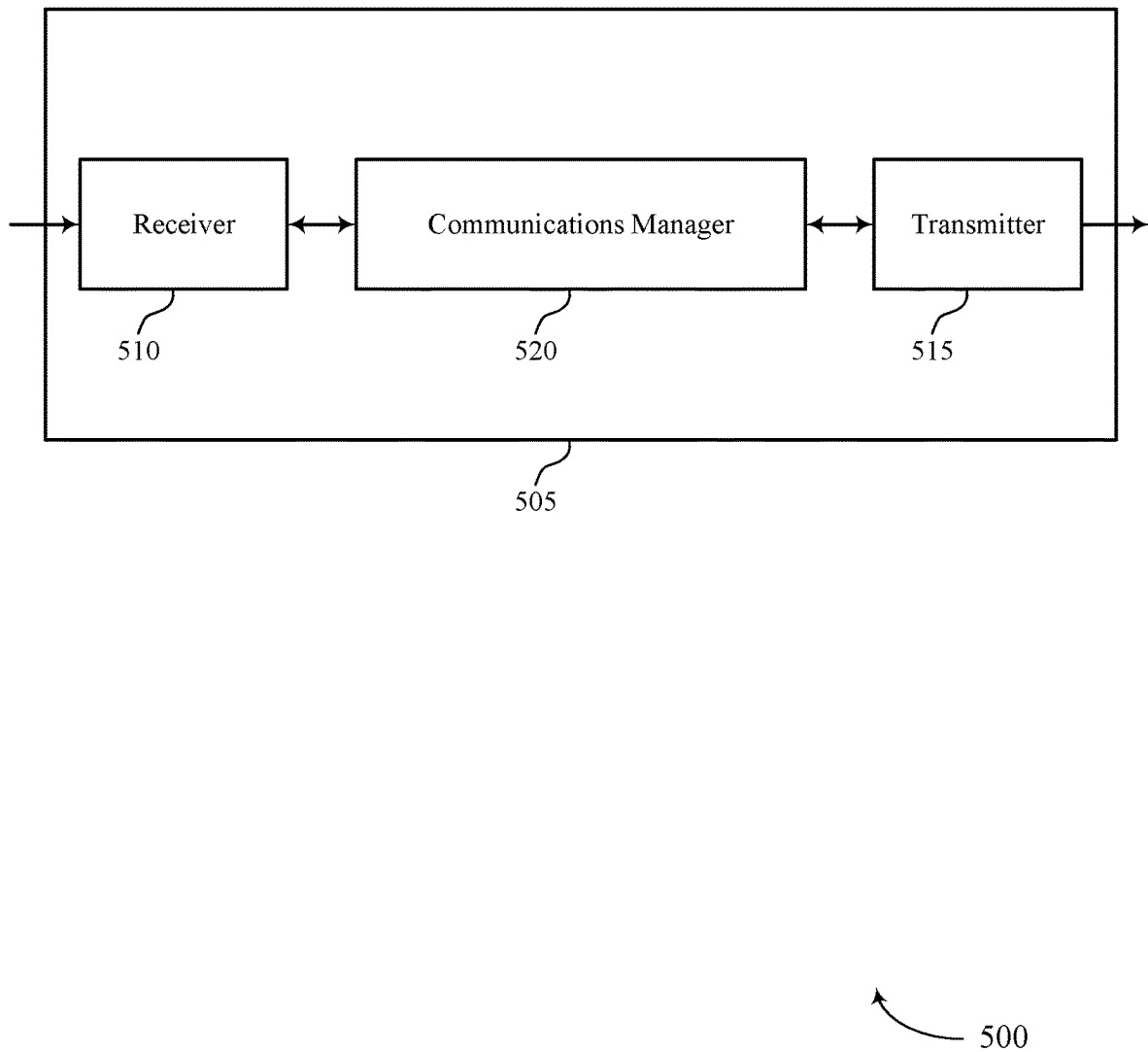
FIGS. 5 and 6 show block diagrams of devices that support correlation-based hardware sequences for layered decoding in accordance with one or more aspects of the present disclosure.

FIG. 5 shows a block diagram 500 of a device 505 that supports correlation-based hardware sequences for layered decoding in accordance with one or more aspects of the present disclosure. The device 505 may be an example of aspects of a UE 115 as described herein. The device 505 may include a receiver 510, a transmitter 515, and a communications manager 520. The device 505 may also include a processor. Each of these components may be in communication with one another (e.g., via one or more buses).

The receiver 510 may provide a means for receiving information such as packets, user data, control information, or any combination thereof associated with various information channels (e.g., control channels, data channels, information channels related to correlation-based hardware sequences for layered decoding). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to correlation-based hardware sequences for layered decoding). In some examples, the transmitter 515 may be co-located with a receiver 510 in a transceiver module. The transmitter 515 may utilize a single antenna or a set of multiple antennas.

The communications manager 520, the receiver 510, the transmitter 515, or various combinations thereof or various components thereof may be examples of means for performing various aspects of correlation-based hardware sequences for layered decoding as described herein. For example, the communications manager 520, the receiver 510, the transmitter 515, or various combinations or components thereof may support a method for performing one or more of the functions described herein.

In some examples, the communications manager 520, the receiver 510, the transmitter 515, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 520, the receiver 510, the transmitter 515, or various combinations or components thereof may be implemented in code (e.g., as communications management software or firmware) executed by a processor. If implemented in code executed by a processor, the functions of the communications manager 520, the receiver 510, the transmitter 515, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 520 may be configured to perform various operations (e.g., receiving, obtaining, monitoring, outputting, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to obtain information, output information, or perform various other operations as described herein.

The communications manager 520 may support wireless communications at a UE in accordance with examples as disclosed herein. For example, the communications manager 520 may be configured as or otherwise support a means for partitioning a set of multiple layers of a submatrix associated with a parity check decoding procedure into a first set of layers and a second set of layers. The communications manager 520 may be configured as or otherwise support a means for sorting the first set of layers into a first set of layer orders based on a first set of correlation values associated with the first set of layers. The communications manager

520 may be configured as or otherwise support a means for sorting the second set of layers into a second set of layer orders based on a second set of correlation values associated with the second set of layers. The communications manager 520 may be configured as or otherwise support a means for combining the first set of layer orders and the second set of layer orders to obtain a set of combined layer orders. The communications manager 520 may be configured as or otherwise support a means for selecting a decoding schedule from a set of decoding schedules for decoding each of the set of combined layer orders based on respective schedule lengths for the set of decoding schedules.

By including or configuring the communications manager 520 in accordance with examples as described herein, the device 505 (e.g., a processor controlling or otherwise coupled with the receiver 510, the transmitter 515, the communications manager 520, or a combination thereof) may support techniques for correlation-based hardware sequences for layered decoding which may result in reduced processing, reduced power consumption, and more efficient utilization of communication resources, among other advantages.

Figure 6:
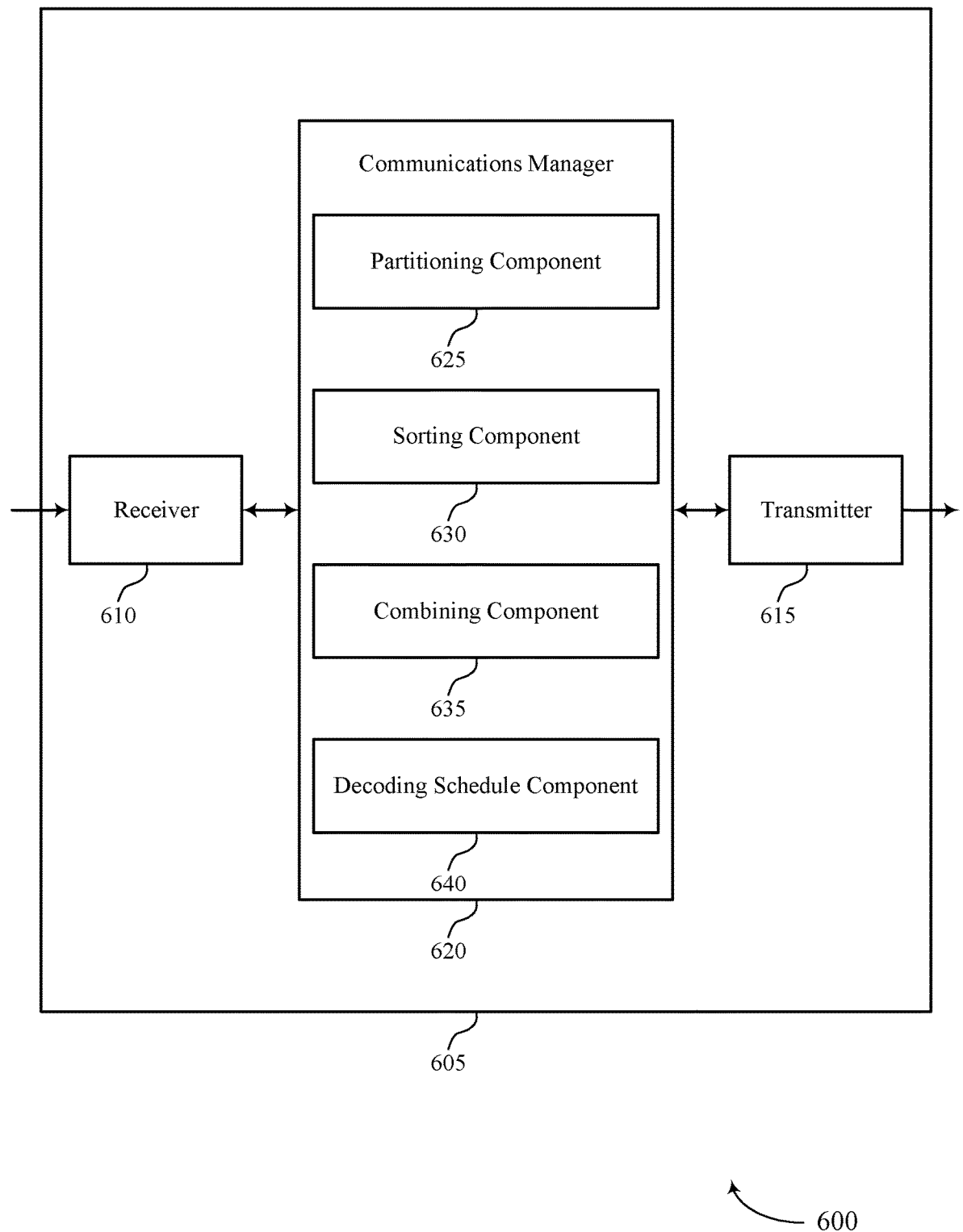

FIG. 6 shows a block diagram 600 of a device 605 that supports correlation-based hardware sequences for layered decoding in accordance with one or more aspects of the present disclosure. The device 605 may be an example of aspects of a device 505 or a UE 115 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to correlation-based hardware sequences for layered decoding). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to correlation-based hardware sequences for layered decoding). In some examples, the transmitter 615 may be co-located with a receiver 610 in a transceiver module. The transmitter 615 may utilize a single antenna or a set of multiple antennas.

The device 605, or various components thereof, may be an example of means for performing various aspects of correlation-based hardware sequences for layered decoding as described herein. For example, the communications manager 620 may include a partitioning component 625, a sorting component 630, a combining component 635, a decoding schedule component 640, or any combination thereof. The communications manager 620 may be an example of aspects of a communications manager 520 as described herein. In some examples, the communications manager 620, or various components thereof, may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications at a UE in accordance with examples as disclosed herein. The partitioning component 625 may be configured as or otherwise support a means for partitioning a set of multiple layers of a submatrix associated with a parity check decoding procedure into a first set of layers and a second set of layers. The sorting component 630 may be configured as or otherwise support a means for sorting the first set of layers into a first set of layer orders based on a first set of correlation values associated with the first set of layers. The sorting component 630 may be configured as or otherwise support a means for sorting the second set of layers into a second set of layer orders based on a second set of correlation values associated with the second set of layers. The combining component 635 may be configured as or otherwise support a means for combining the first set of layer orders and the second set of layer orders to obtain a set of combined layer orders. The decoding schedule component 640 may be configured as or otherwise support a means for selecting a decoding schedule from a set of decoding schedules for decoding each of the set of combined layer orders based on respective schedule lengths for the set of decoding schedules.

Figure 7:
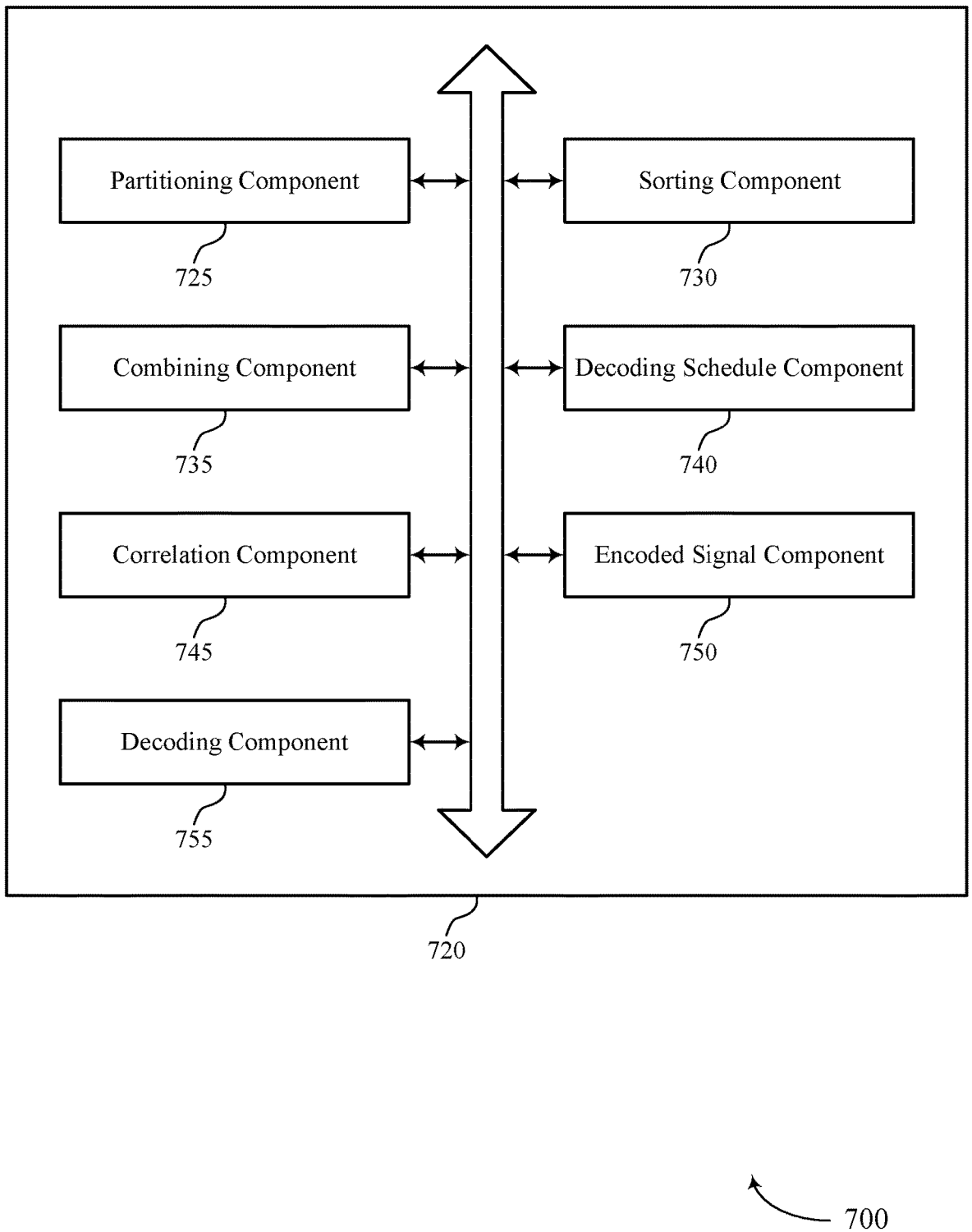
FIG. 7 shows a block diagram of a communications manager that supports correlation-based hardware sequences for layered decoding in accordance with one or more aspects of the present disclosure.

FIG. 7 shows a block diagram 700 of a communications manager 720 that supports correlation-based hardware sequences for layered decoding in accordance with one or more aspects of the present disclosure. The communications manager 720 may be an example of aspects of a communications manager 520, a communications manager 620, or both, as described herein. The communications manager 720, or various components thereof, may be an example of means for performing various aspects of correlation-based hardware sequences for layered decoding as described herein. For example, the communications manager 720 may include a partitioning component 725, a sorting component 730, a combining component 735, a decoding schedule component 740, a correlation component 745, an encoded signal component 750, a decoding component 755, or any combination thereof. Each of these components may communicate, directly or indirectly, with one another (e.g., via one or more buses).

The communications manager 720 may support wireless communications at a UE in accordance with examples as disclosed herein. The partitioning component 725 may be configured as or otherwise support a means for partitioning a set of multiple layers of a submatrix associated with a parity check decoding procedure into a first set of layers and a second set of layers. The sorting component 730 may be configured as or otherwise support a means for sorting the first set of layers into a first set of layer orders based on a first set of correlation values associated with the first set of layers. In some examples, the sorting component 730 may be configured as or otherwise support a means for sorting the second set of layers into a second set of layer orders based on a second set of correlation values associated with the second set of layers. The combining component 735 may be configured as or otherwise support a means for combining the first set of layer orders and the second set of layer orders to obtain a set of combined layer orders. The decoding schedule component 740 may be configured as or otherwise support a means for selecting a decoding schedule from a set of decoding schedules for decoding each of the set of combined layer orders based on respective schedule lengths for the set of decoding schedules.

In some examples, the correlation component 745 may be configured as or otherwise support a means for determining the first set of correlation values based on one or more combinations of layers of the first set of layers. In some examples, the correlation component 745 may be configured as or otherwise support a means for generating a first correlation table including the first set of correlation values.

In some examples, the sorting component 730 may be configured as or otherwise support a means for selecting a starting layer from the first set of layers for a first layer order. In some examples, the sorting component 730 may be configured as or otherwise support a means for sorting a set of remaining layers of the first set of layers for the first layer order based on the first set of correlation values, where the first set of layer orders includes the first layer order.

In some examples, the correlation component 745 may be configured as or otherwise support a means for identifying a quantity of overlapping non-zero columns in each combination of the one or more combinations of layers of the first set of layers, where the first set of correlation values is based on the quantity of overlapping non-zero columns.

In some examples, the correlation component 745 may be configured as or otherwise support a means for determining the second set of correlation values based on one or more combinations of layers of the second set of layers. In some examples, the correlation component 745 may be configured as or otherwise support a means for generating a second correlation table including the second set of correlation values.

In some examples, the sorting component 730 may be configured as or otherwise support a means for selecting a starting layer from the second set of layers for a first layer order. In some examples, the sorting component 730 may be configured as or otherwise support a means for sorting a set of remaining layers of the second set of layers for the first layer order based on the second set of correlation values, where the second set of layer orders includes the first layer order.

In some examples, the correlation component 745 may be configured as or otherwise support a means for identifying a quantity of overlapping non-zero columns in each combination of the one or more combinations of layers of the first set of layers, where the first set of correlation values is based on the quantity of overlapping non-zero columns.

In some examples, to support combining the first set of layer orders and the second set of layer orders, the combining component 735 may be configured as or otherwise support a means for concatenating each layer order of the first set of layer orders with each layer order of the second set of layer orders to obtain the set of combined layer orders.

In some examples, partitioning the set of multiple layers of the submatrix is based on a punctured column for each layer of the set of multiple layers.

In some examples, the first set of layers are associated with one punctured column and the second set of layers are associated with two punctured columns.

In some examples, the decoding schedule component 740 may be configured as or otherwise support a means for generating a respective decoding schedule for each layer order of the set of combined layer orders to obtain the set of decoding schedules.

In some examples, the decoding schedule component 740 may be configured as or otherwise support a means for determining a respective schedule length for each decoding schedule of the set of decoding schedules. In some examples, the decoding schedule component 740 may be configured as or otherwise support a means for selecting the decoding schedule having a length below a threshold.

In some examples, the encoded signal component 750 may be configured as or otherwise support a means for receiving a encoded signal associated with the parity check decoding procedure. In some examples, the encoded signal component 750 may be configured as or otherwise support a means for identifying a base graph matrix associated with the encoded signal. In some examples, the encoded signal component 750 may be configured as or otherwise support a means for extracting the submatrix from the base graph matrix associated with the encoded signal. In some examples, the decoding component 755 may be configured as or otherwise support a means for decoding the encoded signal based on the selected decoding schedule.

Figure 8:
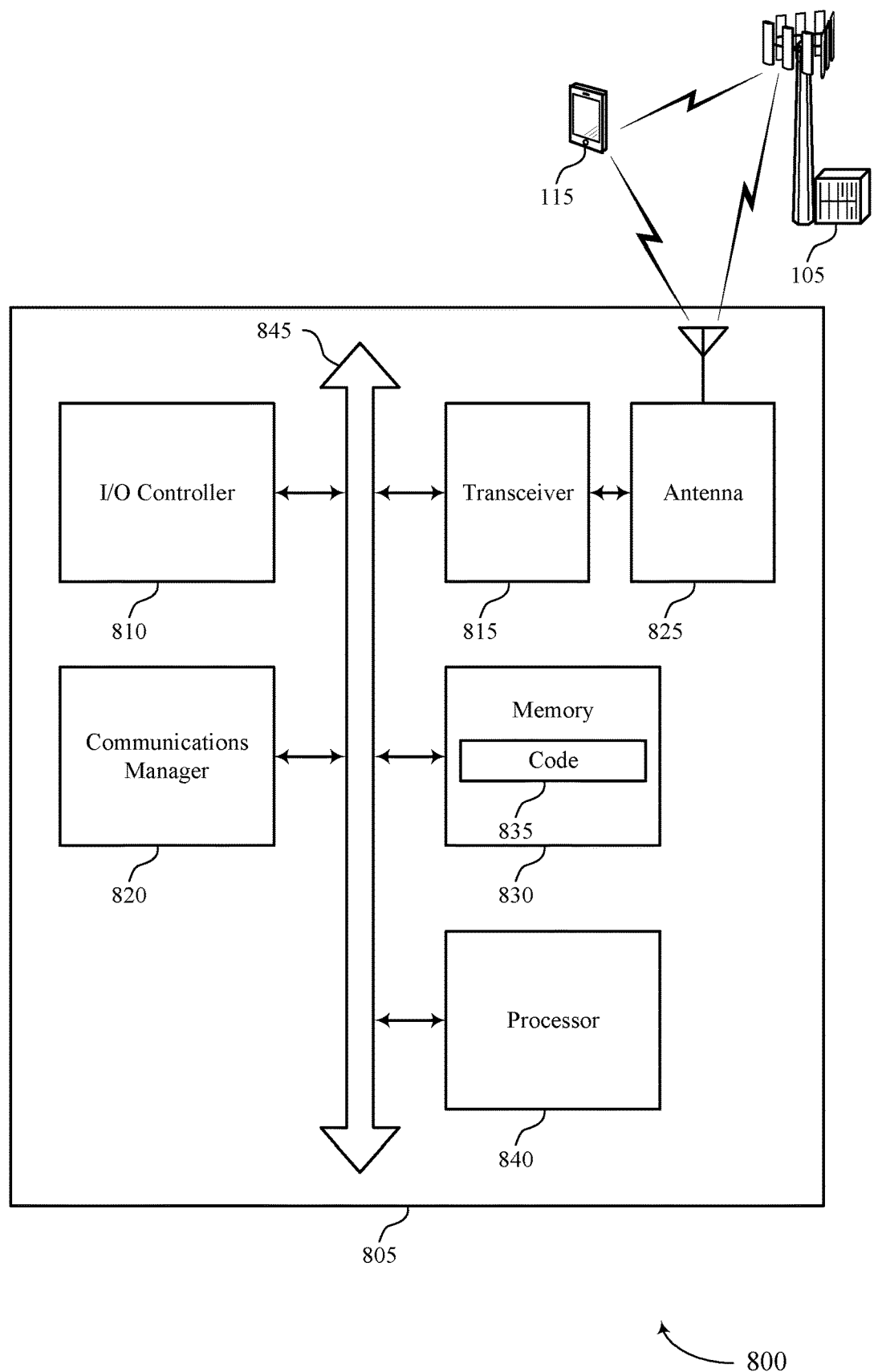
FIG. 8 shows a diagram of a system including a device that supports correlation-based hardware sequences for layered decoding in accordance with one or more aspects of the present disclosure.

FIG. 8 shows a diagram of a system 800 including a device 805 that supports correlation-based hardware sequences for layered decoding in accordance with one or more aspects of the present disclosure. The device 805 may be an example of or include the components of a device 505, a device 605, or a UE 115 as described herein. The device 805 may communicate (e.g., wirelessly) with one or more network entities 105, one or more UEs 115, or any combination thereof. The device 805 may include components for bi-directional voice and data communications including components for transmitting and receiving communications, such as a communications manager 820, an input/output (I/O) controller 810, a transceiver 815, an antenna 825, a memory 830, code 835, and a processor 840. These components may be in electronic communication or otherwise coupled (e.g., operatively, communicatively, functionally, electronically, electrically) via one or more buses (e.g., a bus 845).

The I/O controller 810 may manage input and output signals for the device 805. The I/O controller 810 may also manage peripherals not integrated into the device 805. In some cases, the I/O controller 810 may represent a physical connection or port to an external peripheral. In some cases, the I/O controller 810 may utilize an operating system such as iOS®, ANDROID®, MS-DOS®, MS-WINDOWS®, OS/2®, UNIX®, LINUX®, or another known operating system. Additionally or alternatively, the I/O controller 810 may represent or interact with a modem, a keyboard, a mouse, a touchscreen, or a similar device. In some cases, the I/O controller 810 may be implemented as part of a processor, such as the processor 840. In some cases, a user may interact with the device 805 via the I/O controller 810 or via hardware components controlled by the I/O controller 810.

In some cases, the device 805 may include a single antenna 825. However, in some other cases, the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets, to provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The memory 830 may include random access memory (RAM) and read-only memory (ROM). The memory 830 may store computer-readable, computer-executable code 835 including instructions that, when executed by the processor 840, cause the device 805 to perform various functions described herein. The code 835 may be stored in a non-transitory computer-readable medium such as system memory or another type of memory. In some cases, the code 835 may not be directly executable by the processor 840 but may cause a computer (e.g., when compiled and executed) to perform functions described herein. In some cases, the memory 830 may contain, among other things, a basic I/O system (BIOS) which may control basic hardware or software operation such as the interaction with peripheral components or devices.

The processor 840 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In some other cases, a memory controller may be integrated into the processor 840. The processor 840 may be configured to execute computer-readable instructions stored in a memory (e.g., the memory 830) to cause the device 805 to perform various functions (e.g., functions or tasks supporting correlation-based hardware sequences for layered decoding). For example, the device 805 or a component of the device 805 may include a processor 840 and memory 830 coupled with or to the processor 840, the processor 840 and memory 830 configured to perform various functions described herein.

The communications manager 820 may support wireless communications at a UE in accordance with examples as disclosed herein. For example, the communications manager 820 may be configured as or otherwise support a means for partitioning a set of multiple layers of a submatrix associated with a parity check decoding procedure into a first set of layers and a second set of layers. The communications manager 820 may be configured as or otherwise support a means for sorting the first set of layers into a first set of layer orders based on a first set of correlation values associated with the first set of layers. The communications manager 820 may be configured as or otherwise support a means for sorting the second set of layers into a second set of layer orders based on a second set of correlation values associated with the second set of layers. The communications manager 820 may be configured as or otherwise support a means for combining the first set of layer orders and the second set of layer orders to obtain a set of combined layer orders. The communications manager 820 may be configured as or otherwise support a means for selecting a decoding schedule from a set of decoding schedules for decoding each of the set of combined layer orders based on respective schedule lengths for the set of decoding schedules.

By including or configuring the communications manager 820 in accordance with examples as described herein, the device 805 may support techniques for correlation-based hardware sequences for layered decoding which may result in improved communication reliability, reduced latency, improved user experience related to reduced processing, reduced power consumption, more efficient utilization of communication resources, improved coordination between devices, longer battery life, and improved utilization of processing capability, among other advantages.

In some examples, the communications manager 820 may be configured to perform various operations (e.g., receiving, monitoring, transmitting) using or otherwise in cooperation with the transceiver 815, the one or more antennas 825, or any combination thereof. Although the communications manager 820 is illustrated as a separate component, in some examples, one or more functions described with reference to the communications manager 820 may be supported by or performed by the processor 840, the memory 830, the code 835, or any combination thereof. For example, the code 835 may include instructions executable by the processor 840 to cause the device 805 to perform various aspects of correlation-based hardware sequences for layered decoding as described herein, or the processor 840 and the memory 830 may be otherwise configured to perform or support such operations.

Figure 9:
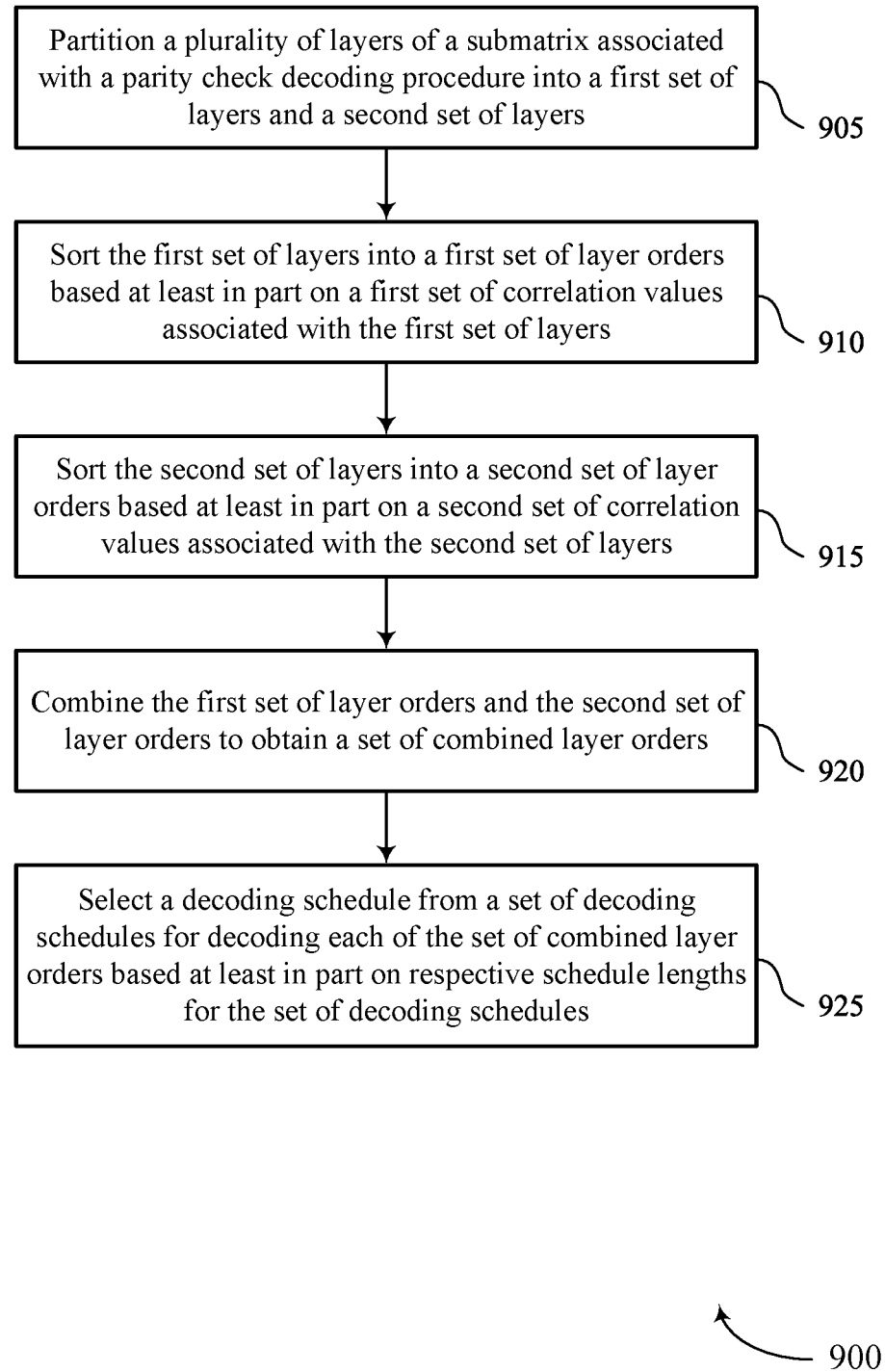
FIGS. 9 through 11 show flowcharts illustrating methods that support correlation-based hardware sequences for layered decoding in accordance with one or more aspects of the present disclosure.

FIG. 9 shows a flowchart illustrating a method 900 that supports correlation-based hardware sequences for layered decoding in accordance with one or more aspects of the present disclosure. The operations of the method 900 may be implemented by a UE or its components as described herein. For example, the operations of the method 900 may be performed by a UE 115 as described with reference to FIGS. 1 through 8. In some examples, a UE may execute a set of instructions to control the functional elements of the UE to perform the described functions. Additionally, or alternatively, the UE may perform aspects of the described functions using special-purpose hardware.

At 905, the method may include partitioning a set of multiple layers of a submatrix associated with a parity check decoding procedure into a first set of layers and a second set of layers. The operations of 905 may be performed in accordance with examples as disclosed herein. In some examples, aspects of the operations of 905 may be performed by a partitioning component 725 as described with reference to FIG. 7.

At 910, the method may include sorting the first set of layers into a first set of layer orders based on a first set of correlation values associated with the first set of layers. The operations of 910 may be performed in accordance with examples as disclosed herein. In some examples, aspects of the operations of 910 may be performed by a sorting component 730 as described with reference to FIG. 7.

At 915, the method may include sorting the second set of layers into a second set of layer orders based on a second set of correlation values associated with the second set of layers. The operations of 915 may be performed in accordance with examples as disclosed herein. In some examples, aspects of the operations of 915 may be performed by a sorting component 730 as described with reference to FIG. 7.

At 920, the method may include combining the first set of layer orders and the second set of layer orders to obtain a set of combined layer orders. The operations of 920 may be performed in accordance with examples as disclosed herein. In some examples, aspects of the operations of 920 may be performed by a combining component 735 as described with reference to FIG. 7.

At 925, the method may include selecting a decoding schedule from a set of decoding schedules for decoding each of the set of combined layer orders based on respective schedule lengths for the set of decoding schedules. The operations of 925 may be performed in accordance with examples as disclosed herein. In some examples, aspects of the operations of 925 may be performed by a decoding schedule component 740 as described with reference to FIG. 7.

Figure 10:
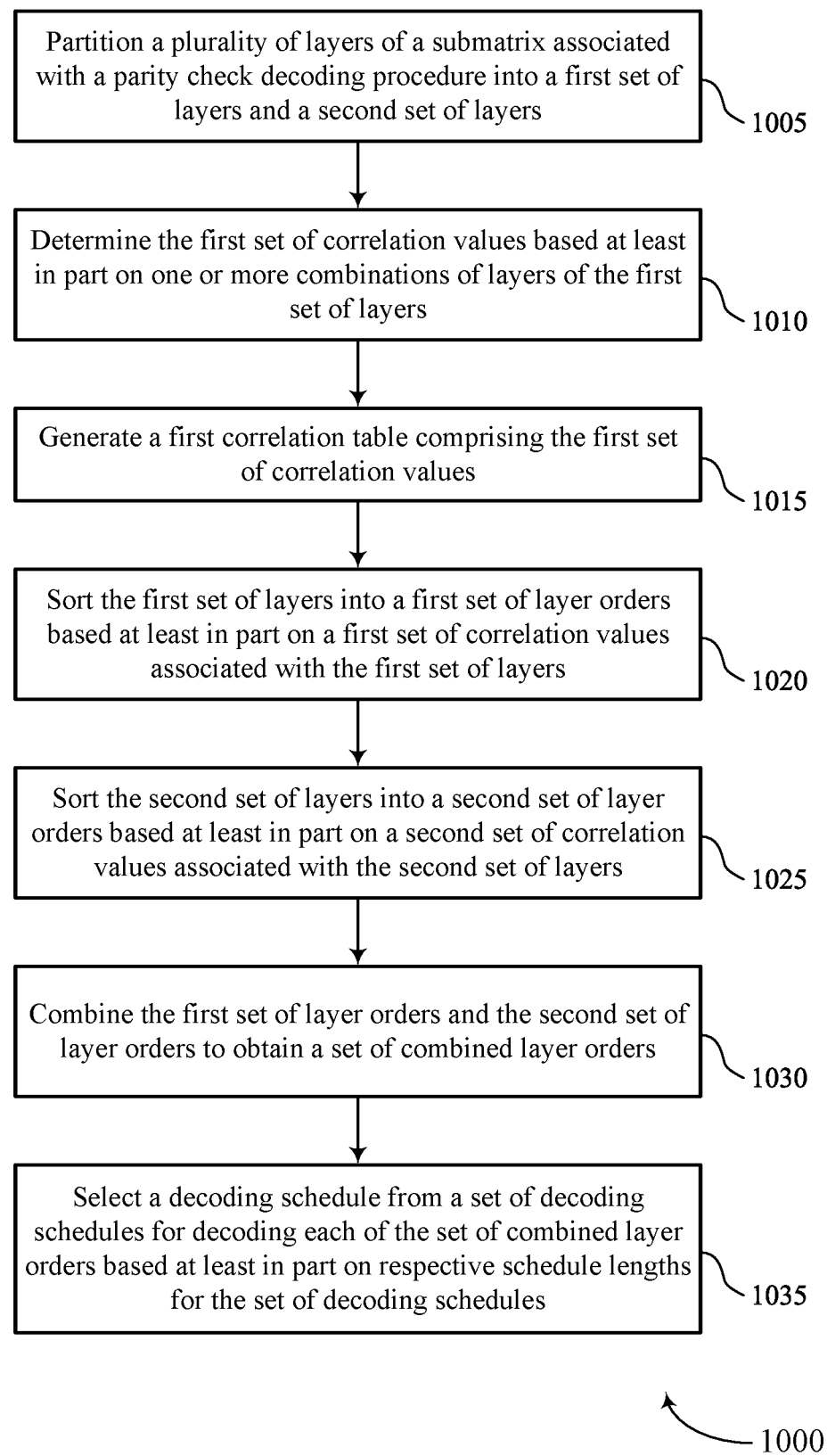

FIG. 10 shows a flowchart illustrating a method 1000 that supports correlation-based hardware sequences for layered decoding in accordance with one or more aspects of the present disclosure. The operations of the method 1000 may be implemented by a UE or its components as described herein. For example, the operations of the method 1000 may be performed by a UE 115 as described with reference to FIGS. 1 through 8. In some examples, a UE may execute a set of instructions to control the functional elements of the UE to perform the described functions. Additionally, or alternatively, the UE may perform aspects of the described functions using special-purpose hardware.

At 1005, the method may include partitioning a set of multiple layers of a submatrix associated with a parity check decoding procedure into a first set of layers and a second set of layers. The operations of 1005 may be performed in accordance with examples as disclosed herein. In some examples, aspects of the operations of 1005 may be performed by a partitioning component 725 as described with reference to FIG. 7.

At 1010, the method may include determining the first set of correlation values based on one or more combinations of layers of the first set of layers. The operations of 1010 may be performed in accordance with examples as disclosed herein. In some examples, aspects of the operations of 1010 may be performed by a correlation component 745 as described with reference to FIG. 7.

At 1015, the method may include generating a first correlation table including the first set of correlation values. The operations of 1015 may be performed in accordance with examples as disclosed herein. In some examples, aspects of the operations of 1015 may be performed by a correlation component 745 as described with reference to FIG. 7.

At 1020, the method may include sorting the first set of layers into a first set of layer orders based on a first set of correlation values associated with the first set of layers. The operations of 1020 may be performed in accordance with examples as disclosed herein. In some examples, aspects of the operations of 1020 may be performed by a sorting component 730 as described with reference to FIG. 7.

At 1025, the method may include sorting the second set of layers into a second set of layer orders based on a second set of correlation values associated with the second set of layers. The operations of 1025 may be performed in accordance with examples as disclosed herein. In some examples, aspects of the operations of 1025 may be performed by a sorting component 730 as described with reference to FIG. 7.

At 1030, the method may include combining the first set of layer orders and the second set of layer orders to obtain a set of combined layer orders. The operations of 1030 may be performed in accordance with examples as disclosed herein. In some examples, aspects of the operations of 1030 may be performed by a combining component 735 as described with reference to FIG. 7.

At 1035, the method may include selecting a decoding schedule from a set of decoding schedules for decoding each of the set of combined layer orders based on respective schedule lengths for the set of decoding schedules. The operations of 1035 may be performed in accordance with examples as disclosed herein. In some examples, aspects of the operations of 1035 may be performed by a decoding schedule component 740 as described with reference to FIG. 7.

Figure 11:
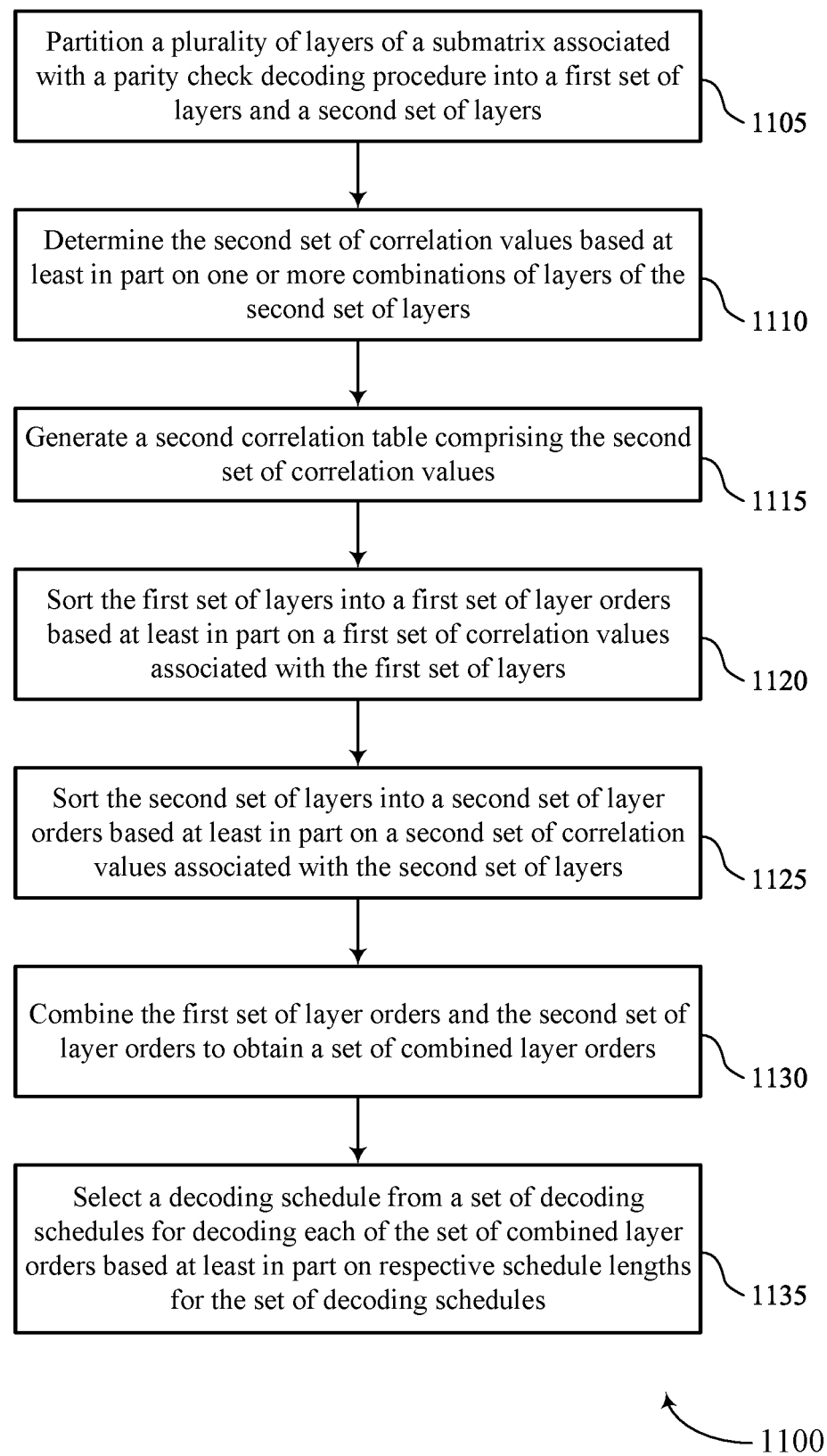

FIG. 11 shows a flowchart illustrating a method 1100 that supports correlation-based hardware sequences for layered decoding in accordance with one or more aspects of the present disclosure. The operations of the method 1100 may be implemented by a UE or its components as described herein. For example, the operations of the method 1100 may be performed by a UE 115 as described with reference to FIGS. 1 through 8. In some examples, a UE may execute a set of instructions to control the functional elements of the UE to perform the described functions. Additionally, or alternatively, the UE may perform aspects of the described functions using special-purpose hardware.

At 1105, the method may include partitioning a set of multiple layers of a submatrix associated with a parity check decoding procedure into a first set of layers and a second set of layers. The operations of 1105 may be performed in accordance with examples as disclosed herein. In some examples, aspects of the operations of 1105 may be performed by a partitioning component 725 as described with reference to FIG. 7.

At 1110, the method may include determining the second set of correlation values based on one or more combinations of layers of the second set of layers. The operations of 1110 may be performed in accordance with examples as disclosed herein. In some examples, aspects of the operations of 1110 may be performed by a correlation component 745 as described with reference to FIG. 7.

At 1115, the method may include generating a second correlation table including the second set of correlation values. The operations of 1115 may be performed in accordance with examples as disclosed herein. In some examples, aspects of the operations of 1115 may be performed by a correlation component 745 as described with reference to FIG. 7.

At 1120, the method may include sorting the first set of layers into a first set of layer orders based on a first set of correlation values associated with the first set of layers. The operations of 1120 may be performed in accordance with examples as disclosed herein. In some examples, aspects of the operations of 1120 may be performed by a sorting component 730 as described with reference to FIG. 7.

At 1125, the method may include sorting the second set of layers into a second set of layer orders based on a second set of correlation values associated with the second set of layers. The operations of 1125 may be performed in accordance with examples as disclosed herein. In some examples, aspects of the operations of 1125 may be performed by a sorting component 730 as described with reference to FIG. 7.

At 1130, the method may include combining the first set of layer orders and the second set of layer orders to obtain a set of combined layer orders. The operations of 1130 may be performed in accordance with examples as disclosed herein. In some examples, aspects of the operations of 1130 may be performed by a combining component 735 as described with reference to FIG. 7.

At 1135, the method may include selecting a decoding schedule from a set of decoding schedules for decoding each of the set of combined layer orders based on respective schedule lengths for the set of decoding schedules. The operations of 1135 may be performed in accordance with examples as disclosed herein. In some examples, aspects of the operations of 1135 may be performed by a decoding schedule component 740 as described with reference to FIG. 7.

The following provides an overview of aspects of the present disclosure:

Aspect 1: A method for wireless communications at a UE, comprising: partitioning a plurality of layers of a submatrix associated with a parity check decoding procedure into a first set of layers and a second set of layers; sorting the first set of layers into a first set of layer orders based at least in part on a first set of correlation values associated with the first set of layers; sorting the second set of layers into a second set of layer orders based at least in part on a second set of correlation values associated with the second set of layers; combining the first set of layer orders and the second set of layer orders to obtain a set of combined layer orders; and selecting a decoding schedule from a set of decoding schedules for decoding each of the set of combined layer orders based at least in part on respective schedule lengths for the set of decoding schedules.

Aspect 2: The method of aspect 1, further comprising: determining the first set of correlation values based at least in part on one or more combinations of layers of the first set of layers; and generating a first correlation table comprising the first set of correlation values.

Aspect 3: The method of aspect 2, further comprising: selecting a starting layer from the first set of layers for a first layer order; and sorting a set of remaining layers of the first set of layers for the first layer order based at least in part on the first set of correlation values, wherein the first set of layer orders comprises the first layer order.

Aspect 4: The method of any of aspects 2 through 3, further comprising: identifying a quantity of overlapping non-zero columns in each combination of the one or more combinations of layers of the first set of layers, wherein the first set of correlation values is based at least in part on the quantity of overlapping non-zero columns.

Aspect 5: The method of any of aspects 1 through 4, further comprising: determining the second set of correlation values based at least in part on one or more combinations of layers of the second set of layers; and generating a second correlation table comprising the second set of correlation values.

Aspect 6: The method of aspect 5, further comprising: selecting a starting layer from the second set of layers for a first layer order; and sorting a set of remaining layers of the second set of layers for the first layer order based at least in part on the second set of correlation values, wherein the second set of layer orders comprises the first layer order.

Aspect 7: The method of any of aspects 5 through 6, further comprising: identifying a quantity of overlapping non-zero columns in each combination of the one or more combinations of layers of the first set of layers, wherein the first set of correlation values is based at least in part on the quantity of overlapping non-zero columns.

Aspect 8: The method of any of aspects 1 through 7, wherein combining the first set of layer orders and the second set of layer orders comprises: concatenating each layer order of the first set of layer orders with each layer order of the second set of layer orders to obtain the set of combined layer orders.

Aspect 9: The method of any of aspects 1 through 8, wherein partitioning the plurality of layers of the submatrix is based at least in part on a punctured column for each layer of the plurality of layers.

Aspect 10: The method of aspect 9, wherein the first set of layers are associated with one punctured column and the second set of layers are associated with two punctured columns.

Aspect 11: The method of any of aspects 1 through 10, further comprising: generating a respective decoding schedule for each layer order of the set of combined layer orders to obtain the set of decoding schedules.

Aspect 12: The method of any of aspects 1 through 11, further comprising: determining a respective schedule length for each decoding schedule of the set of decoding schedules; and selecting the decoding schedule having a length below a threshold.

Aspect 13: The method of any of aspects 1 through 12, further comprising: receiving a encoded signal associated with the parity check decoding procedure; identifying a base graph matrix associated with the encoded signal; extracting the submatrix from the base graph matrix associated with the encoded signal; and decoding the encoded signal based at least in part on the selected decoding schedule.

Aspect 14: An apparatus for wireless communications at a UE, comprising a processor; memory coupled with the processor; and instructions stored in the memory and executable by the processor to cause the apparatus to perform a method of any of aspects 1 through 13.

Aspect 15: An apparatus for wireless communications at a UE, comprising at least one means for performing a method of any of aspects 1 through 13.

Aspect 16: A non-transitory computer-readable medium storing code for wireless communications at a UE, the code comprising instructions executable by a processor to perform a method of any of aspects 1 through 13.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communications at a user equipment (UE), comprising:
   receiving, from a network entity, an encoded signal associated with a parity check decoding procedure;
   partitioning a plurality of layers of a submatrix associated with the encoded signal into a first set of layers and a second set of layers;
   sorting the first set of layers into a first set of layer orders based at least in part on a first set of correlation values associated with the first set of layers;
   sorting the second set of layers into a second set of layer orders based at least in part on a second set of correlation values associated with the second set of layers;
   combining the first set of layer orders and the second set of layer orders to obtain a set of combined layer orders;
   selecting a decoding schedule from a set of decoding schedules for decoding each of the set of combined layer orders based at least in part on respective schedule lengths for the set of decoding schedules;
   decoding the encoded signal based at least in part on the selected decoding schedule; and
   transmitting, to the network entity, a feedback message indicating feedback for the encoded signal based at least in part on the decoding of the encoded signal.

2. The method of claim 1, further comprising:
   determining the first set of correlation values based at least in part on one or more combinations of layers of the first set of layers; and
   generating a first correlation table comprising the first set of correlation values.

3. The method of claim 2, further comprising:
   selecting a starting layer from the first set of layers for a first layer order; and
   sorting a set of remaining layers of the first set of layers for the first layer order based at least in part on the first set of correlation values, wherein the first set of layer orders comprises the first layer order.

4. The method of claim 2, further comprising:
   identifying a quantity of overlapping non-zero columns in each combination of the one or more combinations of layers of the first set of layers, wherein the first set of correlation values is based at least in part on the quantity of overlapping non-zero columns.

5. The method of claim 1, further comprising:
determining the second set of correlation values based at least in part on one or more combinations of layers of the second set of layers; and
generating a second correlation table comprising the second set of correlation values.

6. The method of claim 5, further comprising:
selecting a starting layer from the second set of layers for a first layer order; and
sorting a set of remaining layers of the second set of layers for the first layer order based at least in part on the second set of correlation values, wherein the second set of layer orders comprises the first layer order.

7. The method of claim 5, further comprising:
identifying a quantity of overlapping non-zero columns in each combination of the one or more combinations of layers of the first set of layers, wherein the first set of correlation values is based at least in part on the quantity of overlapping non-zero columns.

8. The method of claim 1, wherein combining the first set of layer orders and the second set of layer orders comprises:
concatenating each layer order of the first set of layer orders with each layer order of the second set of layer orders to obtain the set of combined layer orders.

9. The method of claim 1, wherein partitioning the plurality of layers of the submatrix is based at least in part on a punctured column for each layer of the plurality of layers.

10. The method of claim 9, wherein the first set of layers are associated with one punctured column and the second set of layers are associated with two punctured columns.

11. The method of claim 1, further comprising:
generating a respective decoding schedule for each layer order of the set of combined layer orders to obtain the set of decoding schedules.

12. The method of claim 1, further comprising:
determining a respective schedule length for each decoding schedule of the set of decoding schedules; and
selecting the decoding schedule having a length below a threshold.

13. The method of claim 1, further comprising:
identifying a base graph matrix associated with the encoded signal; and
extracting the submatrix from the base graph matrix associated with the encoded signal.

14. An apparatus for wireless communications at a user equipment (UE), comprising:
a processor;
memory coupled with the processor; and
instructions stored in the memory and executable by the processor to cause the apparatus to:
receive, from a network entity, an encoded signal associated with a parity check decoding procedure;
partition a plurality of layers of a submatrix associated with the encoded signal into a first set of layers and a second set of layers;
sort the first set of layers into a first set of layer orders based at least in part on a first set of correlation values associated with the first set of layers;
sort the second set of layers into a second set of layer orders based at least in part on a second set of correlation values associated with the second set of layers;
combine the first set of layer orders and the second set of layer orders to obtain a set of combined layer orders;
select a decoding schedule from a set of decoding schedules for decoding each of the set of combined layer orders based at least in part on respective schedule lengths for the set of decoding schedules;
decode the encoded signal based at least in part on the selected decoding schedule; and
transmit, to the network entity, a feedback message indicating feedback for the encoded signal based at least in part on the decoding of the encoded signal.

15. The apparatus of claim 14, wherein the instructions are further executable by the processor to cause the apparatus to:
determine the first set of correlation values based at least in part on one or more combinations of layers of the first set of layers; and
generate a first correlation table comprising the first set of correlation values.

16. The apparatus of claim 15, wherein the instructions are further executable by the processor to cause the apparatus to:
select a starting layer from the first set of layers for a first layer order; and
sort a set of remaining layers of the first set of layers for the first layer order based at least in part on the first set of correlation values, wherein the first set of layer orders comprises the first layer order.

17. The apparatus of claim 15, wherein the instructions are further executable by the processor to cause the apparatus to:
identify a quantity of overlapping non-zero columns in each combination of the one or more combinations of layers of the first set of layers, wherein the first set of correlation values is based at least in part on the quantity of overlapping non-zero columns.

18. The apparatus of claim 14, wherein the instructions are further executable by the processor to cause the apparatus to:
determine the second set of correlation values based at least in part on one or more combinations of layers of the second set of layers; and
generate a second correlation table comprising the second set of correlation values.

19. The apparatus of claim 18, wherein the instructions are further executable by the processor to cause the apparatus to:
select a starting layer from the second set of layers for a first layer order; and
sort a set of remaining layers of the second set of layers for the first layer order based at least in part on the second set of correlation values, wherein the second set of layer orders comprises the first layer order.

20. The apparatus of claim 18, wherein the instructions are further executable by the processor to cause the apparatus to:
identify a quantity of overlapping non-zero columns in each combination of the one or more combinations of layers of the first set of layers, wherein the first set of correlation values is based at least in part on the quantity of overlapping non-zero columns.

21. The apparatus of claim 14, wherein the instructions to combine the first set of layer orders and the second set of layer orders are executable by the processor to cause the apparatus to:

concatenate each layer order of the first set of layer orders with each layer order of the second set of layer orders to obtain the set of combined layer orders.

22. The apparatus of claim 14 wherein partitioning the plurality of layers of the submatrix is based at least in part on a punctured column for each layer of the plurality of layers.

23. The apparatus of claim 22, wherein the first set of layers are associated with one punctured column and the second set of layers are associated with two punctured columns.

24. The apparatus of claim 14, wherein the instructions are further executable by the processor to cause the apparatus to:
generate a respective decoding schedule for each layer order of the set of combined layer orders to obtain the set of decoding schedules.

25. The apparatus of claim 14, wherein the instructions are further executable by the processor to cause the apparatus to:
determine a respective schedule length for each decoding schedule of the set of decoding schedules; and
select the decoding schedule having a length below a threshold.

26. The apparatus of claim 14, wherein the instructions are further executable by the processor to cause the apparatus to:
identify a base graph matrix associated with the encoded signal; and
extract the submatrix from the base graph matrix associated with the encoded signal.

27. A non-transitory computer-readable medium storing code for wireless communications at a user equipment (UE), the code comprising instructions executable by a processor to:
receive, from a network entity, an encoded signal associated with a parity check decoding procedure;
partition a plurality of layers of a submatrix associated with the encoded signal into a first set of layers and a second set of layers;
sort the first set of layers into a first set of layer orders based at least in part on a first set of correlation values associated with the first set of layers;
sort the second set of layers into a second set of layer orders based at least in part on a second set of correlation values associated with the second set of layers;
combine the first set of layer orders and the second set of layer orders to obtain a set of combined layer orders;
select a decoding schedule from a set of decoding schedules for decoding each of the set of combined layer orders based at least in part on respective schedule lengths for the set of decoding schedules;
decode the encoded signal based at least in part on the selected decoding schedule; and
transmit, to the network entity, a feedback message indicating feedback for the encoded signal based at least in part on the decoding of the encoded signal.

* * * * *